United States Patent
Hanada et al.

(10) Patent No.: US 12,158,661 B2
(45) Date of Patent: Dec. 3, 2024

(54) DISPLAY DEVICE

(71) Applicant: Japan Display Inc., Tokyo (JP)

(72) Inventors: Akihiro Hanada, Minato-ku (JP); Takuo Kaitoh, Minato-ku (JP); Ryo Onodera, Minato-ku (JP); Tomoyuki Ito, Minato-ku (JP); Yoshinori Tanaka, Minato-ku (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/502,178

(22) Filed: Nov. 6, 2023

(65) Prior Publication Data
US 2024/0168335 A1 May 23, 2024

(30) Foreign Application Priority Data

Nov. 17, 2022 (JP) .................................. 2022-184279

(51) Int. Cl.
*G02F 1/13357* (2006.01)
*G02F 1/1334* (2006.01)
*H01L 27/12* (2006.01)

(52) U.S. Cl.
CPC ...... *G02F 1/133615* (2013.01); *G02F 1/1334* (2013.01); *H01L 27/1225* (2013.01)

(58) Field of Classification Search
CPC ............... H01L 27/1225; G02F 1/1334; G02F 1/133615
See application file for complete search history.

(56) References Cited

U.S. PATENT DOCUMENTS

| | | | | |
|---|---|---|---|---|
| 2009/0115074 | A1* | 5/2009 | Hammer | H01L 23/3192 257/E21.477 |
| 2010/0259715 | A1* | 10/2010 | Tanaka | G02F 1/1345 438/34 |
| 2011/0068388 | A1* | 3/2011 | Yamazaki | H01L 22/14 257/E21.414 |
| 2020/0006183 | A1* | 1/2020 | Huang | H01L 24/08 |
| 2020/0127011 | A1 | 4/2020 | Yamazaki et al. | |
| 2021/0341663 | A1* | 11/2021 | Fukuoka | G02B 6/003 |
| 2022/0004052 | A1 | 1/2022 | Ohue | |
| 2023/0139734 | A1* | 5/2023 | Cao | H01L 27/1255 257/40 |

FOREIGN PATENT DOCUMENTS

JP 2020160254 A 10/2020
WO 2018130920 A1 7/2018

* cited by examiner

*Primary Examiner* — Paisley L Wilson
*Assistant Examiner* — Agnes Dobrowolski
(74) *Attorney, Agent, or Firm* — Maier & Maier, PLLC

(57) ABSTRACT

A display device includes a first nitride insulating film arranged on a first substrate, a gate electrode arranged along a first direction on the first nitride insulating film, a second nitride insulating film arranged on the gate electrode, a first oxide insulating film arranged on the second nitride insulating film, and an oxide semiconductor layer arranged on the first oxide insulating film, wherein the gate electrode has a first titanium layer, an aluminum layer, and a second titanium layer stacked in order from the first nitride insulating film side, and a thickness of the second titanium layer is greater than a thickness of the first titanium layer.

15 Claims, 25 Drawing Sheets

FIG. 12

| Gate electrode formation surface | Glass | 50nm SiOx | 50nm SiNx |
|---|---|---|---|
| Al/Ti = 240nm/150nm | Sample A | Sample D | Sample G |
| Al/Ti = 240nm/50nm | Sample B | Sample E | Sample H |
| Ti/Al/Ti = 10nm/240nm/150nm | Sample C | Sample F | Sample I |

| T-Ti | 150nm | | 240nm | | 50nm | |
|---|---|---|---|---|---|---|
| Al | | | | | | |
| B-Ti | — | 10nm | | — | | 10nm |
| | Sample J | Sample K | | Sample L | | Sample M |
| Center |  |  | |  | |  |
| Edge |  |  | | | | |

DISPLAY DEVICE

CROSS-REFERENCE TO RELATED APPLICATIONS

This application claims the benefit of priority to Japanese Patent Application No. 2022-184279, filed on Nov. 17, 2022, the entire contents of which are incorporated herein by reference.

FIELD

An embodiment of the present invention relates to a display device.

BACKGROUND

In recent years, a transparent display that allows the background of one side to be visually recognizable from the other side has been developed. In a transparent display, an image can be viewed from both front and back surfaces, so that an image or a character can be viewed from two opposite directions with the transparent display interposed therebetween.

In a display device such as a transparent display, in order to reduce wiring resistance of wiring such as a gate wiring and a source wiring, it is preferable to use a wiring material with low resistance. For example, using aluminum or copper as the wiring material with low resistance makes it possible to reduce signal delay. On the other hand, it is known that aluminum has low heat resistance, and unevenness occurs on a wiring due to migration. Therefore, the migration of aluminum is suppressed by stacking a metal material having a melting point higher than that of aluminum such as titanium, molybdenum, or tungsten above aluminum.

SUMMARY

A display device according to an embodiment of the present invention includes a first nitride insulating film arranged on a first substrate, a gate electrode arranged along a first direction on the first nitride insulating film, a second nitride insulating film arranged on the gate electrode, a first oxide insulating film arranged on the second nitride insulating film, and an oxide semiconductor layer arranged on the first oxide insulating film, wherein the gate electrode has a first titanium layer, an aluminum layer, and a second titanium layer stacked in order from the first nitride insulating film side, and a thickness of the second titanium layer is greater than a thickness of the first titanium layer.

BRIEF DESCRIPTION OF DRAWINGS

FIG. 12 are SEM photographs obtained by observing surface unevenness of gate electrodes and the shapes of end portions for each of Samples A to I.

DESCRIPTION OF EMBODIMENTS

Figure 1:
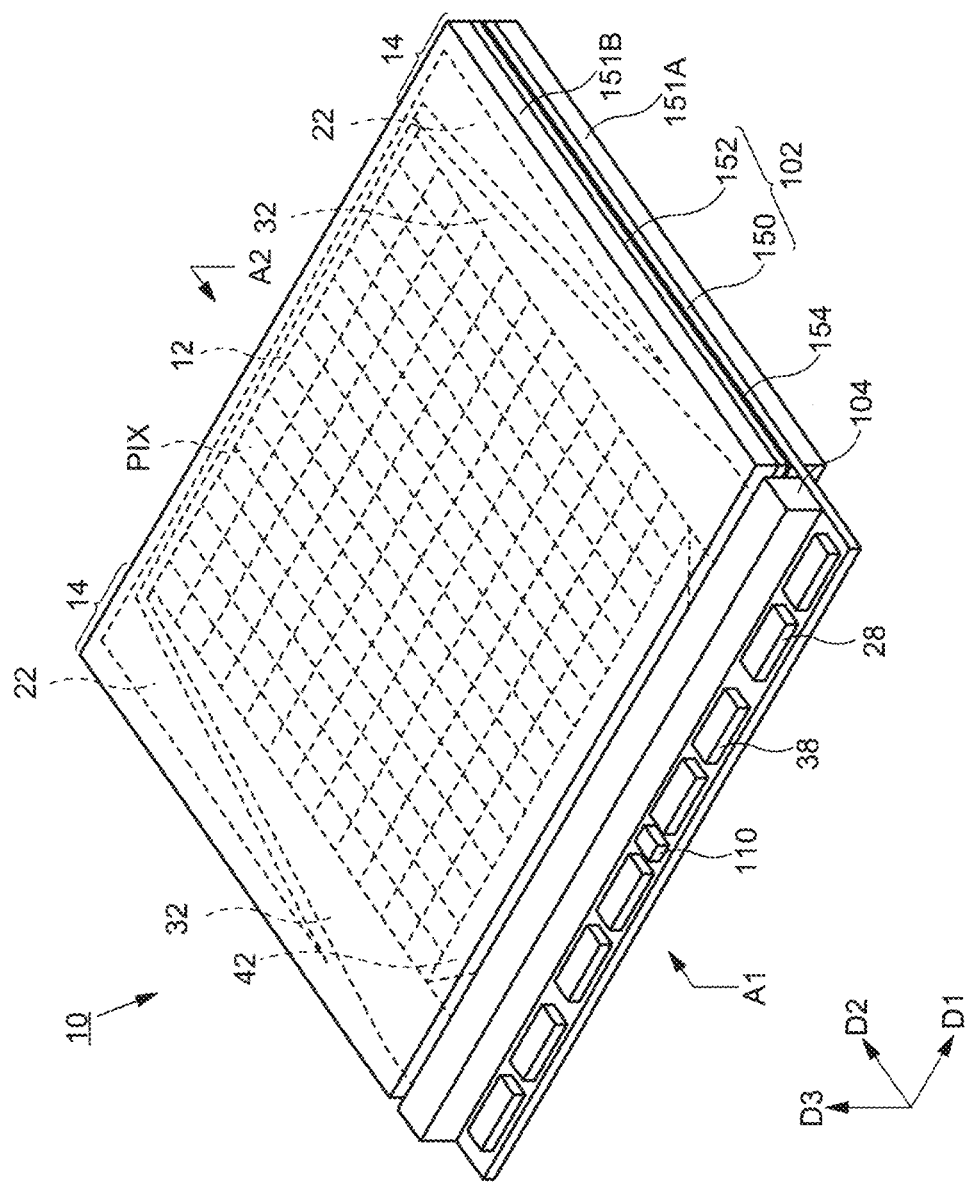
FIG. 1 is a perspective view illustrating an outline of a display device according to an embodiment of the present invention.

Hereinafter, embodiments of the present invention will be described with reference to the drawings and the like. However, the present invention can be implemented in various embodiments without departing from the gist thereof, and is not to be construed as being limited to the description of the embodiments exemplified below. In addition, in order to make the description clearer with respect to the drawings, the width, thickness, shape, and the like of each part may be schematically represented in comparison with actual embodiments, but the schematic drawings are merely examples, and do not limit the interpretation of the present invention. Further, in the present specification and the drawings, the same or similar elements as those described with respect to the above-described drawings are denoted by the same reference signs, and redundant description may be omitted. In addition, in this specification and the like, ordinal numbers are given for convenience in order to distinguish parts, sites, and the like, and do not indicate priority or order.

In the present invention, in the case where a plurality of films is formed by processing a single film, the plurality of films may have different functions and roles. However, the plurality of films is derived from a film formed as the same layer in the same process, and have the same layer structure and the same material. Therefore, the plurality of films is defined as being present in the same layer. In addition, in the case where the plurality of films is formed by processing a certain film, in the present specification and the like, the films may be described separately using −1, −2, and the like.

In this specification and the like, expressions such as "above" and "below" represent a relative positional relationship between a structure of interest and another structure. In the present specification and the like, in a side view, a direction from a first substrate to a pixel electrode, which will be described later, is defined as "above", and a reverse direction thereof is defined as "below". In this specification and claims, the expression "above" in describing the manner of arranging another structure on a certain structure shall include both arranging another structure directly above a certain structure and arranging another structure over a certain structure via yet another structure, unless otherwise specified.

In this specification and the like, a bottom-gate drive is one in which on/off is controlled by a gate electrode arranged below a semiconductor layer. In addition, in this specification and the like, a top-gate drive is one in which on/off is controlled by a gate electrode arranged above the semiconductor layer. Further, in the present specification, a dual-gate drive is one in which on/off is controlled by inputting the same control signal to the gate electrodes arranged above and below the semiconductor layer.

First Embodiment

A display device 10 according to an embodiment of the present invention will be described with reference to FIG. 1 to FIG. 11.

Outline of Display Device

FIG. 1 shows a perspective view of the display device 10 according to an embodiment of the present invention. The display device 10 includes a display panel 102 including an array substrate 150, a counter substrate 152, a liquid crystal layer (not shown) between the array substrate 150 and the counter substrate 152, a gate driving circuit 28, and a source driving circuit 38, a light source 104, and a first transparent substrate 151A and a second transparent substrate 151B sandwiching the display panel 102. In the following explanation referring to FIG. 1, one direction on the plane of the display panel 102 is referred to as a direction D1, a direction orthogonal to the direction D1 is referred to as a direction D2, and a direction orthogonal to a D1-D2 plane is referred to as a direction D3.

The array substrate 150 and the counter substrate 152 have light transmittance. The array substrate 150 and the counter substrate 152 are preferably transparent to visible light. The counter substrate 152 is arranged in the direction D3 so as to face the array substrate 150. The array substrate 150 and the counter substrate 152 are bonded to each other with a seal material 154 while being arranged opposite to each other with a gap therebetween. A liquid crystal layer (not shown) is arranged in the gap between the array substrate 150 and the counter substrate 152.

The display panel 102 has a display region 12 and a peripheral region 14 outside the display region 12. A plurality of pixels PIX is arranged in a row direction and a column direction in the display region 12. In this case, the row direction refers to a direction parallel to the direction D1, and the column direction refers to a direction parallel to the direction D2. In the display region 12, m pixels are arranged in the row direction, and n pixels are arranged in the column direction. The values of m and n are appropriately set in accordance with a display resolution in the vertical direction and a display resolution in the horizontal direction. In the display region 12, a gate wiring (also referred to as a scanning signal line) is arranged in the direction D1, and a source wiring (also referred to as a data signal line) is arranged in the direction D2.

The gate driving circuit 28 and the source driving circuit 38 are arranged in the peripheral region 14 of the array substrate 150. FIG. 1 shows an embodiment in which the gate driving circuit 28 and the source driving circuit 38 are provided as an integrated circuit (IC) and implemented in a COG (Chip on Glass) method in the array substrate 150. The gate driving circuit 28 and the source driving circuit 38 are not limited to the illustrated embodiment, and may be implemented in a COF (Chip on Film) method or may be formed by a thin film transistor (TFT) of the array substrate 150.

A gate wiring region 32, a common wiring region 22, and a source wiring region 42 are arranged in the peripheral region 14. The gate wiring region 32 is a region where a pattern formed by a wiring connecting the gate driving circuit 28 and a gate wiring GL arranged in the display region 12 is arranged. The common wiring region 22 is a region where a pattern formed by a common wiring is arranged. The common wiring region 22 is used as a wiring for applying a common voltage to a common electrode 218 (see FIG. 4) arranged in the counter substrate 152. The source wiring region 42 is a region where a pattern formed by a wiring connecting the source driving circuit 38 and a data signal line 109 arranged in the display region 12 is arranged.

The light source 104 has a structure along the direction D1. For example, the light source 104 is configured by a light-emitting diode (LED) arranged along the direction D1. A detailed structure of the light source 104 is not limited and may include an optical member such as a reflector, a diffuser, a lens, and the like, in addition to a light-emitting diode arranged in the direction D1. The light source 104 and a light emission control circuit 110 for controlling the light source 104 may be arranged as a separate member independent of the display panel 102. In addition, the light source 104 may be one in which light emission timing is controlled by the light emission control circuit 110 synchronized with the gate driving circuit 28 and the source driving circuit 38. Similar to the light source 104, the light emission control circuit 110 for controlling the light source 104 may be arranged as a separate member from the display panel 102, may be mounted on the array substrate 150 as a separate component, or may be incorporated in the gate driving circuit 28 or the source driving circuit 38.

The first transparent substrate 151A and the second transparent substrate 151B are arranged so as to sandwich the display region 12 and the peripheral region 14. The first transparent substrate 151A and the second transparent substrate 151B have a function as a protective member of the display panel 102. In addition, as described with reference to FIG. 2, the first transparent substrate 151A and the second transparent substrate 151B function as a light guide plate for introducing light emitted from the light source 104 into the display panel 102.

Figure 2:
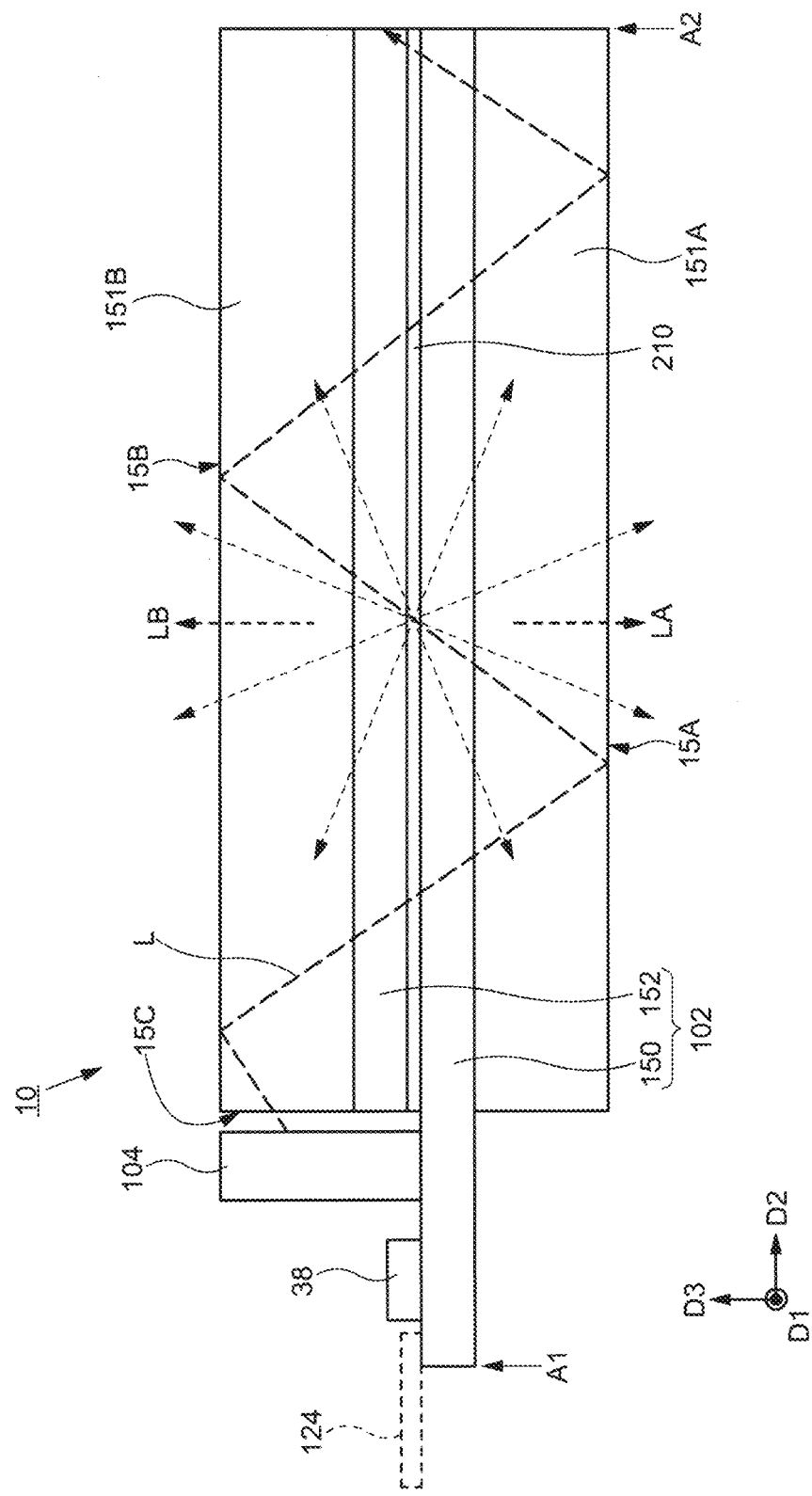
FIG. 2 is a schematic cross-sectional view showing a structure corresponding to A1-A2 of a display device shown in FIG. 1.

FIG. 2 shows a cross-sectional structure of the display device 10 corresponding to A1-A2 shown in FIG. 1. As shown in FIG. 2, the first transparent substrate 151A is arranged on the array substrate 150 side of the display panel 102, and the second transparent substrate 151B is arranged on the counter substrate 152 side. The first transparent substrate 151A and the second transparent substrate 151B may be a glass substrate or a plastic substrate. The first transparent substrate 151A and the second transparent substrate 151B preferably have refractive indices equivalent to those of the array substrate 150 and the counter substrate 152. The array substrate 150, the first transparent substrate 151A, and the counter substrate 152 and the second transparent substrate 151B are bonded to each other with a transparent adhesive (not shown).

The display panel 102 is arranged such that the array substrate 150 and the counter substrate 152 face each other, and a liquid crystal layer 210 is arranged therebetween. The array substrate 150 is larger than the counter substrate 152 and has a size such that part of the peripheral region 14 is exposed from the counter substrate 152. A driving circuit (the source driving circuit 38 in FIG. 2) is arranged in the array substrate 150. In addition, a flexible wiring substrate 124 is attached to the periphery of the array substrate 150.

The light source 104 is arranged adjacent to one side surface of the first transparent substrate 151A or the second transparent substrate 151B. FIG. 2 shows a configuration in which the light source 104 is arranged along one side of the second transparent substrate 151B. In addition, although FIG. 2 shows a configuration in which the light source 104 is attached to the array substrate 150, the configuration is not limited to the configuration in which the light source 104 is arranged, and an attachment configuration is not limited as long as an attachment position can be fixed. For example, the light source 104 may be supported by a housing surrounding the display panel 102.

As shown in FIG. 2, the light source 104 is arranged along a first side 15C of the second transparent substrate 151B. As shown in FIG. 2, the light source 104 irradiates the first side 15C of the second transparent substrate 151B with light L. The light source 104 may also be referred to as a side light source because it emits the light L toward the first side 15C. The first side 15C of the second transparent substrate 151B facing the light source 104 serves as a light incident surface.

As schematically shown in FIG. 2, the light L incident from the first side 15C of the second transparent substrate 151B propagates in a direction away from the first side 15C (the direction D2) while being reflected by a second plane 15B of the counter substrate 152 and a first plane 15A of the first transparent substrate 151A. When the light L is directed to the outside from the first plane 15A of the first transparent substrate 151A and the second plane 15B of the second transparent substrate 151B, the light L proceeds from a medium having a large refractive index to a medium having a small refractive index. In this case, if an incident angle of the light L incident on the first plane 15A and the second plane 15B is larger than the critical angle, the light L is totally reflected, and is guided to the direction D2 while being reflected by the first plane 15A and the second plane 15B.

The liquid crystal layer 210 is formed of a polymer-dispersed liquid crystal. In the liquid crystal layer 210 formed of the polymer dispersed liquid crystal, a scattering state and a non-scattering state are controlled for each pixel PIX (see FIG. 1). As shown in FIG. 2, at least part of the light L propagating while being reflected by the first plane 15A and the second plane 15B is scattered, when there is a pixel in which the liquid crystal layer 210 is in a scattered state, an incident angle of the scattered light becomes an angle smaller than the critical angle, scattered lights LA and LB are emitted to the outside from the first plane 15A and the second plane 15B, respectively, and the emitted scattered lights LA and LB are observed by an observer. In the display panel 102, in a region except for the region where the scattered lights LA and LB are emitted, the array substrate 150, the counter substrate 152, the first transparent substrate 151A, and the second transparent substrate 151B have light transmittance (transparent to visible light) and are substantially transparent because the liquid crystal layer 210 is in a non-scattering state, thereby allowing the observer to view a backside through the display panel 102.

Figure 3:
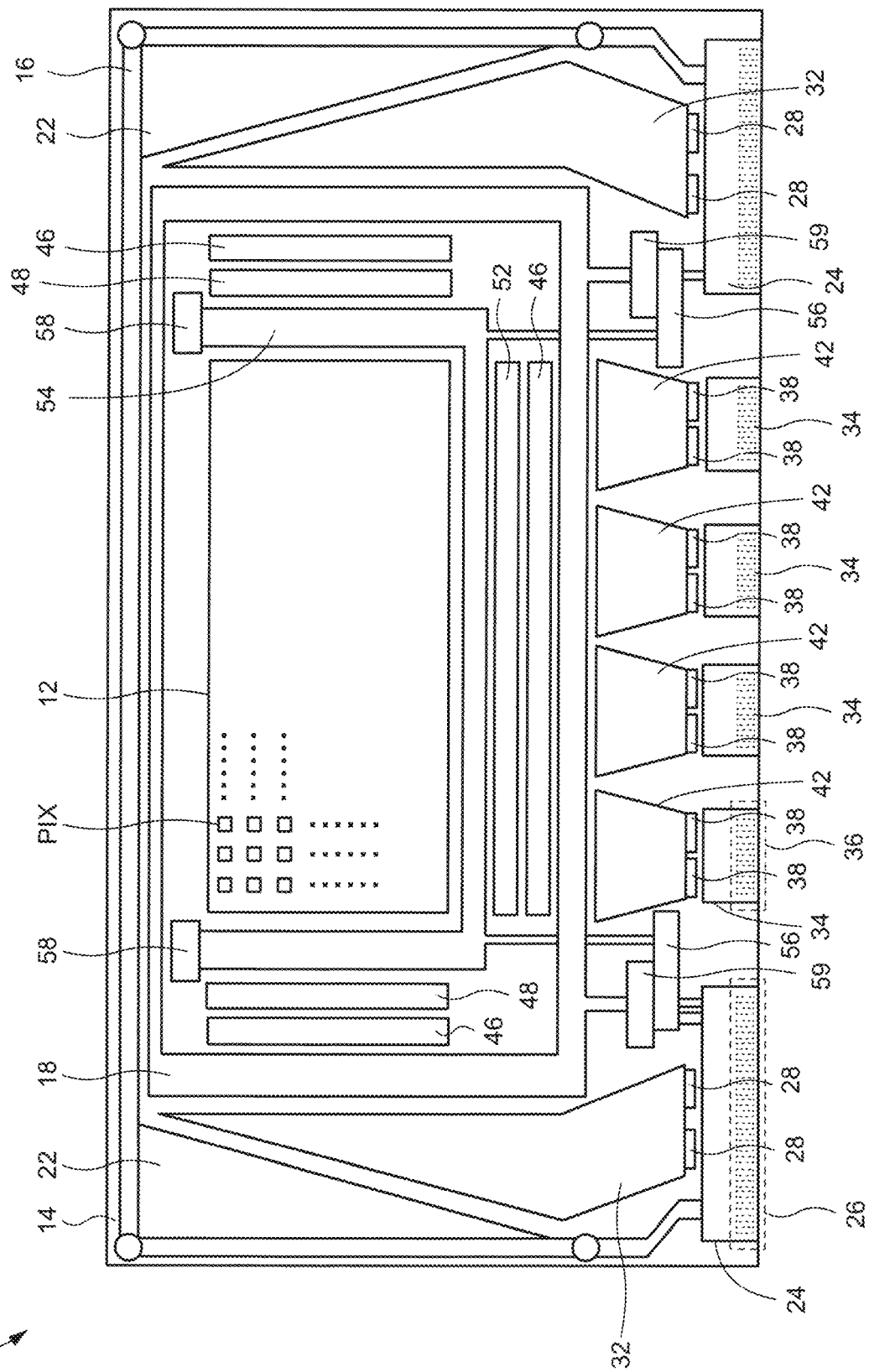
FIG. 3 is a plan view illustrating a configuration of a display device according to an embodiment of the present invention.

FIG. 3 is a plan view illustrating a configuration of the array substrate 150 of the display device 10 according to an embodiment of the present invention. As shown in FIG. 3, the array substrate 150 includes the display region 12 and the peripheral region 14.

The display region 12 includes the plurality of pixels PIX arranged in a matrix. Each of the plurality of pixels PIX includes a plurality of transistors and liquid crystal elements.

The peripheral region 14 is arranged to surround the display region 12. In the array substrate 150, the peripheral region 14 refers to a region from the display region 12 to an edge of the array substrate 150. In other words, the peripheral region 14 shall refer to a region except for the region where the display region 12 is arranged on the array substrate 150 (that is, a region outside the display region 12).

In addition to the gate driving circuit 28 and the source driving circuit 38, the gate wiring region 32, the source wiring region 42, common wirings 16 and 18, the common wiring region 22, terminal portions 26 and 36, flexible printed circuits 24 and 34, and various inspection circuits are arranged in the peripheral region 14. The terminal portions 26 and 36 are arranged along one side of the array substrate 150.

The flexible printed circuit 24 is connected to the terminal portion 26. The flexible printed circuit 24 outputs various signals to the gate driving circuit 28, the common wirings 16 and 18, an ESD protective circuit 59, and a QD pad 56. The gate driving circuit 28 is connected to a plurality of gate wirings GL, and each of the plurality of gate wirings GL is electrically connected to each of the plurality of pixels PIX in the display region 12. In FIG. 3, a region where the plurality of gate wirings GL is arranged is shown as the gate wiring region 32, and a detailed arrangement of the plurality of gate wirings GL is omitted. The number of gate wirings GL connected to the two gate driving circuits 28 corresponds to the number of rows of pixels PIX in the display region 12. In FIG. 3, although a configuration in which the gate wiring region 32 is arranged apart from the display region 12 is shown, actually the gate wiring GL and the pixel PIX are electrically connected to each other.

The flexible printed circuit 34 is connected to the terminal portion 36. The flexible printed circuit 34 outputs a video signal to the source driving circuit 38. The source driving circuit 38 is connected to a plurality of source wirings SL, and each of the plurality of source wirings SL is electrically connected to each of the plurality of pixels PIX in the display region 12. In FIG. 3, a region where the plurality of source wirings SL is arranged is shown as the source wiring region 42, and a detailed arrangement of the plurality of source wirings SL is omitted. The number of source wirings SL connected to the eight source driving circuits 38 corresponds to at least three times the number of columns of pixels PIX in the display region 12. In the present embodiment, the case where the number of source wirings SL is four times the number of columns of pixels PIX in the display region 12 will be described. In FIG. 3, although a configuration in which the source wiring region 42 is arranged apart from the display region 12 is shown, actually the source wiring SL and the pixel PIX are electrically connected to each other.

A common wiring 18, an ESD protective circuit 46, a gate inspection circuit 48, and an inspection line 54 are arranged between the gate wiring region 32 and the display region 12. The common wiring 18, the ESD protective circuit 46, a source inspection circuit 52, and the inspection line 54 are arranged between the source wiring region 42 and the display region 12. The inspection line 54 is connected to an ESD protective circuit 58 and the QD pad 56. In addition, the common wiring 18 is connected to the ESD protective circuit 59.

The common wiring 16 is arranged so as to surround the peripheral region 14 in the array substrate 150, and a signal is supplied from the two flexible printed circuits 24. In addition, the common wiring 16 is electrically connected to the mesh-shaped common wiring region 22.

Cross-Sectional Structure of Pixel

Figure 4:
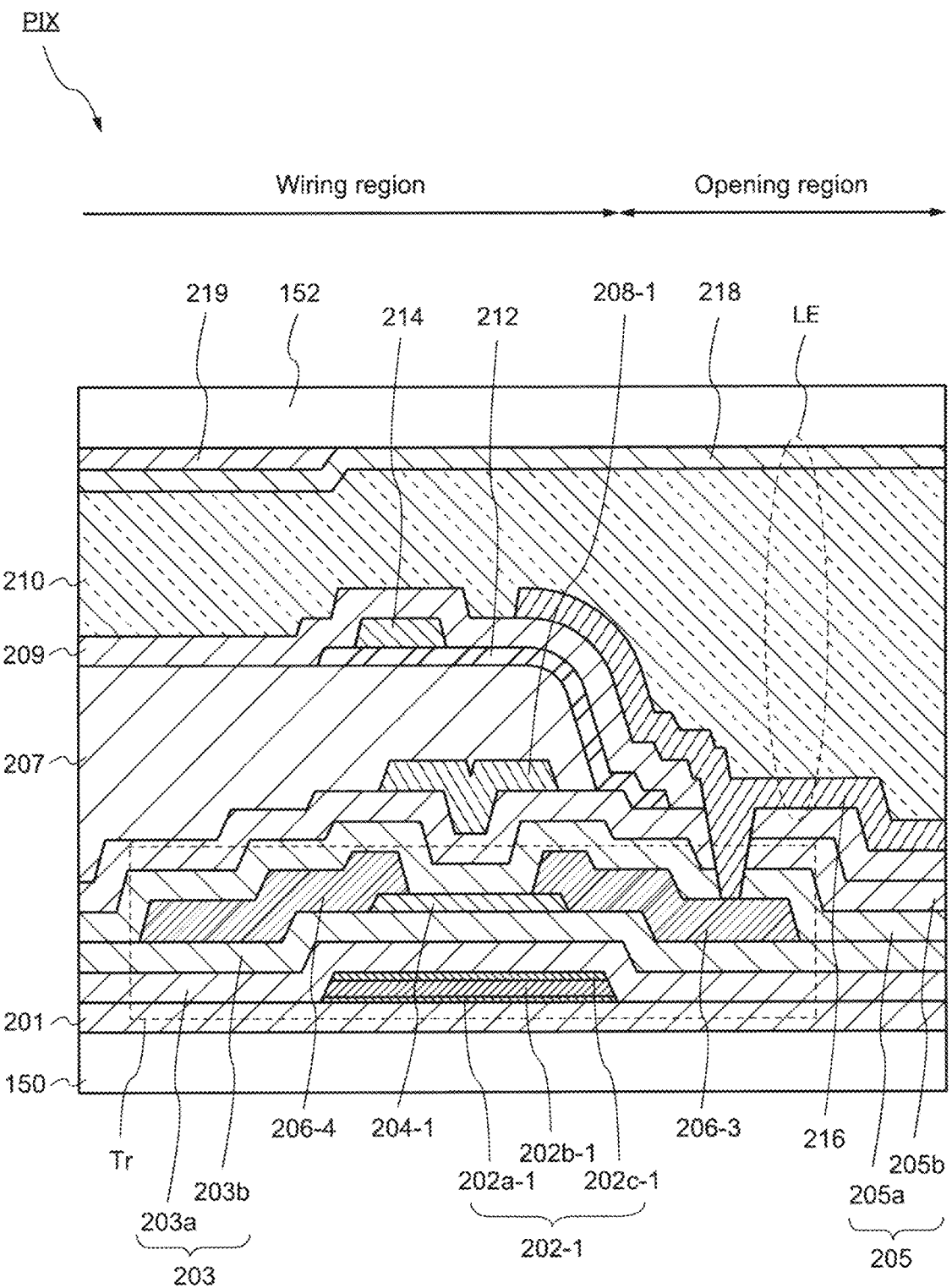
FIG. 4 is a cross-sectional view of a pixel in a display device according to an embodiment of the present invention.

A configuration of the display device 10 according to an embodiment of the present invention will be described with reference to FIG. 4. FIG. 4 is a cross-sectional view of the pixel PIX in the display device 10 according to an embodiment of the present invention.

As shown in FIG. 4, a transistor Tr is arranged above the array substrate 150. The transistor Tr includes a conductive layer 202-1 arranged above the array substrate 150, an oxide semiconductor layer 204-1 arranged opposing the conductive layer 202-1, a gate insulating film 203 arranged between the conductive layer 202-1 and the oxide semiconductor layer 204-1, and a conductive layer 206-3 and a conductive layer 206-4 arranged above the oxide semiconductor layer 204-1. In this case, the conductive layer 202-1 functions as the gate wiring GL (the gate electrode), and the conductive layer 206-4 functions as the source wiring SL (the source electrode). In the present embodiment, an example in which a bottom-gate transistor is used as the transistor Tr will be described.

In the case where the display device 10 is applied to large or high-definition panels, it is preferable to use a wiring material with low resistance in order to reduce wiring resistance of the gate wiring GL and the source wiring SL, and the like. For example, the signal delay can be reduced by using aluminum and copper as the wiring material with low resistance. On the other hand, it is known that aluminum has low heat resistance, and unevenness occurs on a surface of the wiring due to migration. Therefore, migration of aluminum is suppressed by stacking the metal material having a melting point higher than that of aluminum such as titanium, molybdenum, or tungsten on aluminum.

For example, in the case where a thick titanium layer is stacked on an aluminum layer, the titanium layer grows in a columnar shape when the titanium layer is formed. If etching is performed by forming a resist mask on such a titanium layer, the titanium layer is etched into a columnar shape along the columnar shape at an end portion of the resist mask. In addition, the titanium layer etched into the columnar shape serves as a mask, and the aluminum layer is also etched into the columnar shape. As a result, an etching residue is generated on the side surface of the wiring.

As described in FIG. 2, in the transparent display, the light emitted from the light source 104 enters the first side 15C of the second transparent substrate 151B, repeats total reflection, and is guided in the direction D2. Therefore, if the surface of the gate wiring GL and source wiring SL is uneven or if etching residue is generated on the side surface, it may hinder light conduction and reduce luminance.

In addition, an oxide semiconductor having light transmittance is used as a semiconductor layer of the transistor Tr that constituting the transparent display. The oxide semiconductor has a property that oxygen defects are likely to occur in a film forming process. Since the oxide semiconductor layer and the oxide insulating film are in contact, oxygen is released from a silicon oxide film by a heat treatment in the manufacturing process of the display panel 102, thereby repairing oxygen defects. For example, a silicon oxide film is preferably used as the oxide insulating film contacting the oxide semiconductor layer.

When the silicon oxide film is used as the gate insulating film in the bottom-gate transistor, the silicon oxide film may be in contact with the array substrate. However, impurity elements contained in the array substrate may reach the oxide semiconductor layer through the silicon oxide film. In the case where a silicon nitride film and the silicon oxide film are stacked from the gate electrode side as the gate insulating film, the silicon nitride film and the array substrate are in contact, so that the impurity elements contained in the array substrate can be blocked.

As described above, in the case where the silicon nitride film and the silicon oxide film are stacked as the gate insulating film, the chromaticity variation of the transparent display becomes large due to the difference in refractive index between the silicon nitride film and the silicon oxide film.

In an embodiment of the present invention, a first titanium layer 202a-1, an aluminum layer 202b-1, and a second titanium layer 202c-1 are arranged as the conductive layer 202-1 (the gate electrode) above a nitride insulating film 201 (also referred to as a first nitride insulating film) functioning as a base film. In this case, the thickness of the second titanium layer 202c-1 is preferably larger than the thickness of the first titanium layer 202a-1.

The surface unevenness of the gate electrode can be reduced by arranging a stacked layer of the first titanium layer 202a-1, the aluminum layer 202b-1, and the second titanium layer 202c-1 on the nitride insulating film 201. In this case, a thickness of the second titanium layer 202c-1 is preferably 5 times or more and 10 times or less of a thickness of the first titanium layer 202a-1. For example, the thickness of the first titanium layer 202a-1 is 10 nm or more and 25 nm or less. For example, the thickness of the second titanium layer 202c-1 is 50 nm or more and 250 nm or less, preferably 50 nm or more and 150 nm or less, and more preferably 50 nm or more and 100 nm or less. For example, a thickness of the aluminum layer 202b-1 is 100 nm or more and 700 nm or less.

In addition, the first titanium layer 202a-1 is preferably in contact with the nitride insulating film 201. In the case where the oxide insulating film is used as the base film, the surface unevenness of the gate electrode is not improved.

In contrast, it is possible to reduce the surface unevenness of the gate electrode (conductive layer 202) by arranging the first titanium layer 202a-1 in contact with the nitride insulating film 201. In addition, the nitride insulating film 201 is preferred because it can block impurities from the array substrate 150.

The nitride insulating film 201 is in contact with a nitride insulating film 203a (also referred to as a second nitride insulating film), and a total thickness of the nitride insulating film 201 and the nitride insulating film 203a is 600 nm or more and 1000 nm or less. As described above, setting the thicknesses of the nitride insulating film 201 and the nitride insulating film 203a makes it possible to suppress the chromaticity variation of the display device 10.

Since the nitride insulating film 203a is used as part of the gate insulating film 203, the thickness is limited. For example, the thickness of the nitride insulating film 203a is preferably 200 nm or more and 400 nm or less. In this case, the thickness of the nitride insulating film 201 is 200 nm or more and 800 nm or less. Since the nitride insulating film 201 is arranged below the conductive layer 202-1 (the gate electrode), it does not affect the characteristics of the transistor Tr. Therefore, the thickness of the nitride insulating film 201 may be appropriately set depending on the thickness of the nitride insulating film 203a. The thickness of the nitride insulating film 201 may be larger or smaller than the thickness of the nitride insulating film 203a.

The nitride insulating film 203a and an oxide insulating film 203b function as the gate insulating film 203. In this case, for example, the thickness of the gate insulating film 203 is preferably 300 nm or more and 700 nm or less.

An insulating film 205 is arranged above the transistor Tr. The insulating film 205 functions as a passivation film. The insulating film 205 includes an oxide insulating film 205a and a nitride insulating film 205b. Sandwiching the oxide semiconductor layer 204-1 by the oxide insulating film 205a and the oxide insulating film 203b releases oxygen from the oxide insulating film 203b and the oxide insulating film 205a during a process. This is preferable because the oxygen defects in the oxide semiconductor layer 204-1 can be repaired. In addition, a conductive layer 208-1 is arranged above the insulating film 205 at a position facing the oxide semiconductor layer 204-1. The conductive layer 208-1 functions as a back gate electrode. In the present embodiment, although the transistor Tr is described as a bottom-gate-driven transistor, the present invention is not limited to this, and may be a top-gate-driven transistor or a dual-gate-driven transistor.

A planarization film 207 is arranged above the conductive layer 208-1 and the insulating film 205. The planarization film 207 is arranged to alleviate the unevenness of various wirings constituting the transistor Tr. In the case where the display device 10 is applied to the transparent display, the planarization film 207 is preferably removed in an opening region of the pixel PIX. As a result, it is possible to suppress the planarization film 207 from absorbing light in the opening region.

A transparent conductive layer 212 is arranged above the planarization film 207 and the insulating film 205. A conductive layer 214 is arranged above the transparent conductive layer 212. The transparent conductive layer 212 and the conductive layer 214 function as capacitive wirings. An insulating film 209 is arranged above the transparent conductive layer 212 and the conductive layer 214. A pixel electrode 216 is arranged above the insulating film 209. The pixel electrode 216 is connected to the conductive layer 206-3 via an opening arranged in the insulating films 205 and 209.

The counter substrate 152 is arranged to face the array substrate 150. A light-shielding layer 219 and the common electrode 218 are arranged in the counter substrate 152. The light-shielding layer 219 functions as a black matrix. In the structure shown in FIG. 4, the light-shielding layer 219 is arranged in a region overlapping the conductive layer 206-4. The light-shielding layer 219 is arranged in a grid pattern so as to cover the gate wiring GL and source wirings SL1 to SL4 shown in FIG. 7. The common electrode 218 has a size that extends over the entire surface of the display region 12. The light-shielding layer 219 may be formed of a metal film, and functions as an auxiliary electrode by being arranged in contact with the common electrode 218 formed of a transparent conductive film. The liquid crystal layer 210 is arranged between the array substrate 150 and the counter substrate 152 and is sealed with the seal material 154 (see FIG. 1). A liquid crystal element LE is configured by the pixel electrode 216, the liquid crystal layer 210, and the common electrode 218.

Materials of Each Member of Display Device 10

A rigid substrate such as a glass substrate, a quartz substrate, and a sapphire substrate having light transmittance and no flexibility can be used as the array substrate 150 and the counter substrate 152. On the other hand, in the case where the array substrate 150 and the counter substrate 152 need to have flexibility, a flexible substrate containing a resin and having flexibility, such as a polyimide substrate, an acrylic substrate, a siloxane substrate, or a fluororesin substrate can be used as the array substrate 150 and the counter substrate 152. In order to improve the heat resistance of the array substrate 150 and the counter substrate 152, impurities may be introduced into the above resin.

In addition, in the case where the display device 10 is applied to a transparent display or a large or high definition display, a glass substrate is preferably used as the array substrate 150 and the counter substrate 152. In addition, the first transparent substrate 151A and the second transparent substrate 151B are arranged to protect the array substrate 150 and the counter substrate 152. For this reason, for example, it is preferable to use a glass substrate, a plastic substrate, or the like having light transmittance.

Silicon nitride ($SiN_x$), silicon nitride oxide ($SiN_xO_y$), aluminum nitride ($AlN_x$), and aluminum nitride oxide ($AlN_xO_y$) are used as the nitride insulating films 201, 203a, and 205b, and the insulating film 209. In the present embodiment, silicon nitride is used as the nitride insulating films 201, 203a, and 205b, and the insulating film 209. For example, the silicon nitride film is formed by a CVD (Chemical Vapor Deposition) method.

Silicon oxide ($SiO_x$), silicon oxynitride ($SiO_xN_y$), aluminum oxide ($AlO_x$), and aluminum oxynitride ($AlO_xN_y$) are used as the oxide insulating films 203b and 205a. In the present embodiment, silicon oxide is used as the oxide insulating films 203b and 205a. For example, the silicon oxide film is formed by the CVD method.

$SiO_xN_y$ and $AlO_xN_y$ are silicon compound and aluminum compound containing a smaller proportion (x>y) of nitrogen (N) than oxygen (O). $SiN_xO_y$ and $AlN_xO_y$ are silicon compound and aluminum compound containing a lower proportion of oxygen than nitrogen (x>y).

An organic insulating material such as a polyimide resin, an acrylic resin, an epoxy resin, a silicone resin, a fluororesin, or a siloxane resin can be used as the planarization film 207.

As described above, the conductive layer 202 preferably has a configuration in which the wiring material with low resistance is sandwiched between wiring materials with a high melting point. The wiring material with low resistance includes aluminum or copper. In addition, the wiring materials with high a melting point include titanium, molybdenum, or tungsten. Similarly, the conductive layer 206 preferably has a configuration in which the wiring material with low resistance is sandwiched between the wiring materials with a high melting point. In addition, similar to the conductive layer 202, the conductive layer 206 may have a structure in which the first titanium layer 202a, the aluminum layer 202b, and the second titanium layer 202c are stacked in this order.

Common metal materials can be used as the conductive layer 208 and the conductive layer 214. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), and an alloy or compound thereof are used as these members. The above-described material may be used in a single layer or in a stacked layer as the above members.

An oxide semiconductor having semiconductor characteristics can be used as the oxide semiconductor layers 204. The oxide semiconductor layer 204 has light transmittance. For example, an oxide semiconductor containing two or more kinds of metals including indium (In) is used as the oxide semiconductor layers 204. For example, an oxide semiconductor containing indium (In), gallium (Ga), zinc (Zn), and oxygen (O) may be used as the oxide semiconductor layer 204. In particular, an oxide semiconductor having a composition ratio of In:Ga:Zn:O=1:1:1:4 may be used. However, the oxide semiconductor layer 204 used in the present embodiment is not limited to the above-described compositions, and an oxide semiconductor having compositions other than those described above can also be used. For example, in order to improve the mobility, the ratio of In may be larger than the above. In addition, in order to increase a bandgap and reduce an effect of light irradiation, the ratio of Ga may be larger than the above. The oxide semiconductor layer 204 may be amorphous or polycrystalline. The oxide semiconductor layer 204 may be a mixed phase of amorphous and crystal.

A mixture of indium oxide and tin oxide (ITO) and a mixture of indium oxide and zinc oxide (IZO) can be used as the transparent conductive layer 212, the pixel electrode 216, and the common electrode 218. A material other than the above may be used as the transparent conductive layer. The light-shielding layer 219 used for a black matrix BM may be formed of a black resin or metal material. The black matrix BM is formed in contact with the common electrode 218 (see FIG. 4). While the common electrode 218 is formed of a transparent conductive film, and the black matrix BM is formed of a metal material, it is possible to provide a function as an auxiliary electrode for reducing resistance dissipation. The black matrix BM may be formed of a single layer or a stacked layer of chrome, molybdenum, titanium, or the like having relatively low reflectance with respect to aluminum. In the case of stacking, aluminum may be used.

In the case where the display device 10 is applied to a transparent display, a polymer-dispersed liquid crystal is preferably used as the liquid crystal layer 210. The polymer-dispersed liquid crystal includes bulk and fine particles. The orientation of the fine particles changes in the bulk depending on the potential difference between the pixel electrode 216 and the common electrode 218. The degree of at least one of light transmission and distribution is controlled for each pixel PIX by individually controlling the potential of the pixel electrode 216 for each pixel PIX. The degree of scattering of the liquid crystal layer (fine particles) is controlled depending on the voltage of the pixel electrode 216 and the voltage of the common electrode 218. For example, a polymer-dispersed liquid crystal in which the degree of scattering increases as the voltage between each pixel PIX and the common electrode 218 increases, or a polymer-dispersed liquid crystal in which the degree of scattering increases as the voltage between each pixel electrode 216 and the common electrode 218 decreases may be used as the liquid crystal layer.

The ordinary refractive indices of the bulk and the fine particles are equal to each other in the liquid crystal layer 210. In the state where no voltage is applied between the pixel electrode 216 and the common electrode 218, the refractive index difference between the bulk and the fine particles is zero in all directions. The liquid crystal layer 210 is in the non-scattering state, in which the light emitted from the light source is not scattered. As shown in FIG. 2, the light emitted from a light source propagates away from the light source 104 (light-emitting unit) while being reflected on the second plane 15B of the second transparent substrate 151B and the first plane 15A of the first transparent substrate 151A. In the case where the liquid crystal layer 210 is in the non-scattering state, whereby the light L emitted from the light source is not scattered, the background of the counter substrate 152 can be visually recognized from the array substrate 150 and the background of the array substrate 150 can be visually recognized from the counter substrate 152.

Between the pixel electrode 216 and the common electrode 218 to which the voltage is applied, the optical axis of the fine particles will be tilted by the electric field generated between the pixel electrode 216 and the common electrode 218. Since the optical axis of the bulk does not change depending on the electric field, the orientations of the optical axis of the bulk and the optical axis of the fine particles are different from each other. In the pixel PIX having the pixel electrode 216 to which the voltage is applied, the light emitted from the light source is scattered. Light in which part of the light emitted from the light source and scattered as described above is emitted to the outside from the first plane of the first transparent substrate 151A or the second plane of the second transparent substrate 151B is observed by the observer.

In the pixel PIX having the pixel electrode 216 with no voltage applied, the background of the first main surface of the counter substrate 152 is visually recognized from a first main surface of the array substrate 150, and the background of a first main surface 10A of the array substrate 150 is visually recognized from a first main surface 20A of the counter substrate 152. Then, in the display device 10 of the present embodiment, when a video signal is input, a voltage is applied to the pixel electrode 216 of the pixel PIX on which an image is displayed, and an image based on the video signal is visually recognized together with the background. In this way, when the polymer-dispersed liquid crystal is in the scattering state, an image is displayed in the display region.

In the present embodiment, although the case where the nitride insulating film 201 is arranged between the array substrate 150 and the gate electrode (the conductive layer 202-1) arranged above the array substrate 150 will be described, an embodiment of the present invention is not limited to this. For example, a nitride insulating film may be arranged between the counter substrate 152 and the light-shielding layer 219 (in FIG. 4, the light-shielding layer 219 is arranged below the counter substrate 152) arranged above the counter substrate 152. In this case, the stacked structure of the light-shielding layer 219 may have the same stacked structure as the gate electrode. That is, for example, the light-shielding layer 219 may be a stacked structure of the first titanium layer, aluminum, and the second titanium layer. In this case, the first titanium layer is arranged in contact with the nitride insulating film, and the second titanium layer is arranged in contact with the common electrode 218. In addition, the thickness of the second titanium layer is preferably larger than the thickness of the first titanium layer, and the thickness of the second titanium layer is preferably 5 times or more and 10 times or less the thickness of the first titanium layer.

The light-shielding layer 219 is formed above the nitride insulating film formed above the counter substrate 152. It is possible to suppress the occurrence of unevenness on the surface of the light-shielding layer 219 and the occurrence of etching residue on the side surface of the light-shielding layer 219 by setting the light-shielding layer 219 to a stacked structure similar to that of the conductive layer 202 (the gate electrode).

Pixel Circuit

Figure 5:
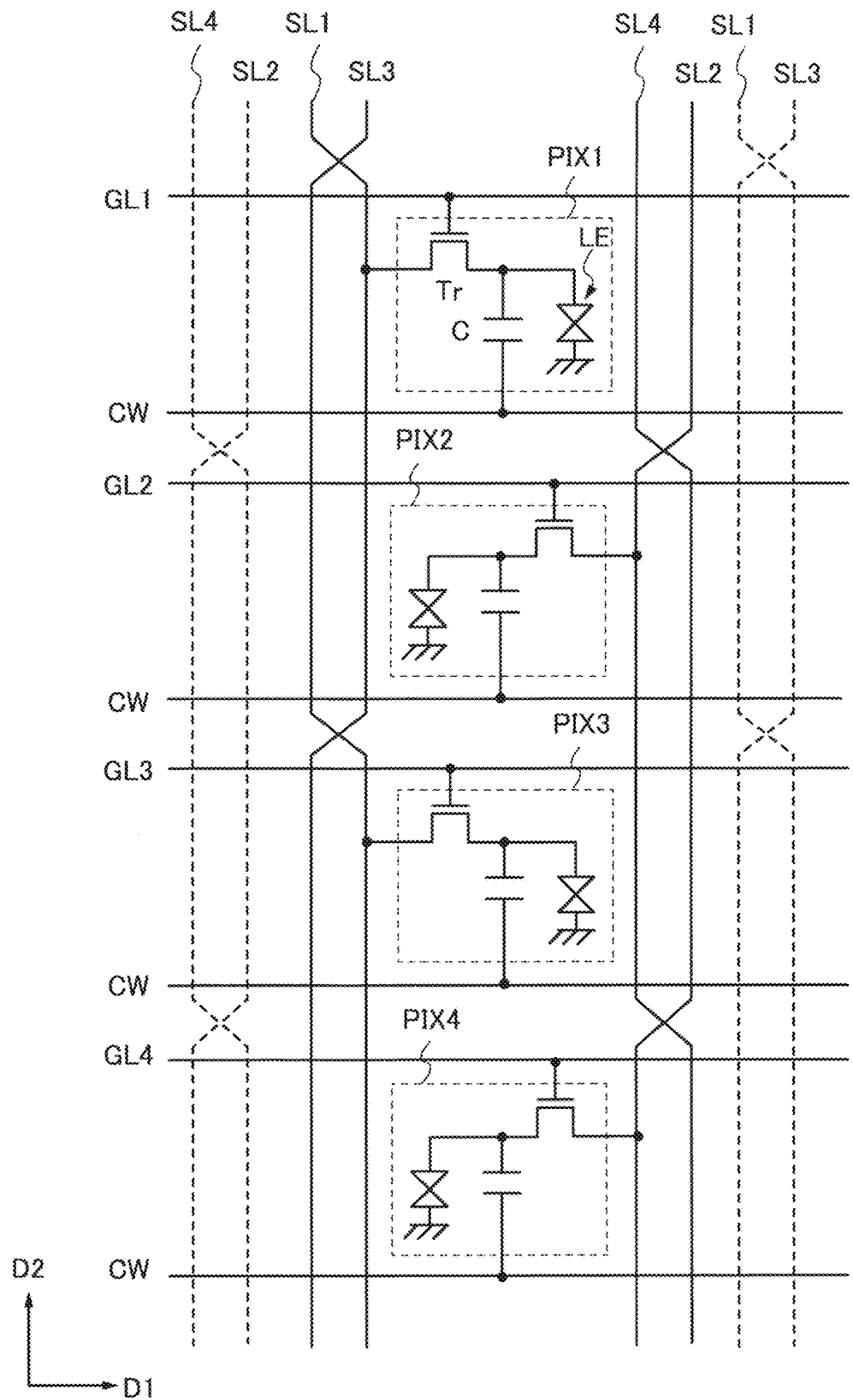
FIG. 5 is a block diagram showing pixels in a display device according to an embodiment of the present invention.

FIG. 5 is a diagram illustrating a pixel circuit of the pixel PIX included in the display device 10 according to an embodiment of the present invention. In the present embodiment, the display device 10 in which an on-voltage is simultaneously supplied to four gate wirings and four pixels arranged in the column direction can be simultaneously charged by four source wirings will be described. As a result, one horizontal period can be made longer than a horizontal period in line order. In other words, it is possible to reduce the time required for scanning all the pixel lines arranged in the display region 12 to ¼. Therefore, in a high-speed driving panel such as a transparent display or a large-sized or high-definition panel, the charging period for the pixel can be sufficiently secured. Hereinafter, a configuration of the pixel according to the present embodiment will be described in detail.

In FIG. 5, four pixels PIX1 to PIX4 are arranged in the column direction (the direction D2). Each of the four pixels PIX1 to PIX4 is electrically connected to each of four gate wirings GL1 to GL4. In addition, each of the four pixels PIX1 to PIX4 is electrically connected to each of the four wirings SL1 to SL4. Each of the four pixels PIX1 to PIX4 is connected to a capacitive wiring CW. In the display region 12, the conductive layer 214 and the transparent conductive layer 212 shown in FIG. 4 correspond to the capacitive wiring CW. In the following explanation, in the case where the pixels PIX1 to PIX4 are not distinguished from each other, they are referred to as the pixel PIX. In the case where the gate wirings GL1 to GL4 and the source wirings SL1 to SL4 are not distinguished from each other, they are referred to as the gate wiring GL and the source wiring SL.

The pixel PIX includes the transistor Tr, the liquid crystal element LE, and a holding capacity C. A gate of the transistor Tr is connected to the gate wiring GL, a source of the transistor Tr is connected to the source wiring SL, and a drain of the transistor Tr is connected to one electrode of the liquid crystal element LE and one electrode of the holding capacity C. The other electrode of the liquid crystal element LE is connected to a common wiring CL. The other electrode of the holding capacity C is connected to the capacitive wiring CW.

The transistor Tr has a function of controlling the writing time of the video signal supplied from the source wiring to the pixel by switching between the on-state and the off-state. When the transistor Tr is turned on, a potential corresponding to the video signal supplied from the source wiring can be written to the holding capacity C electrically connected to the transistor Tr. In addition, when the transistor Tr is turned off, the potential held in the holding capacity C can be held.

Figure 6:
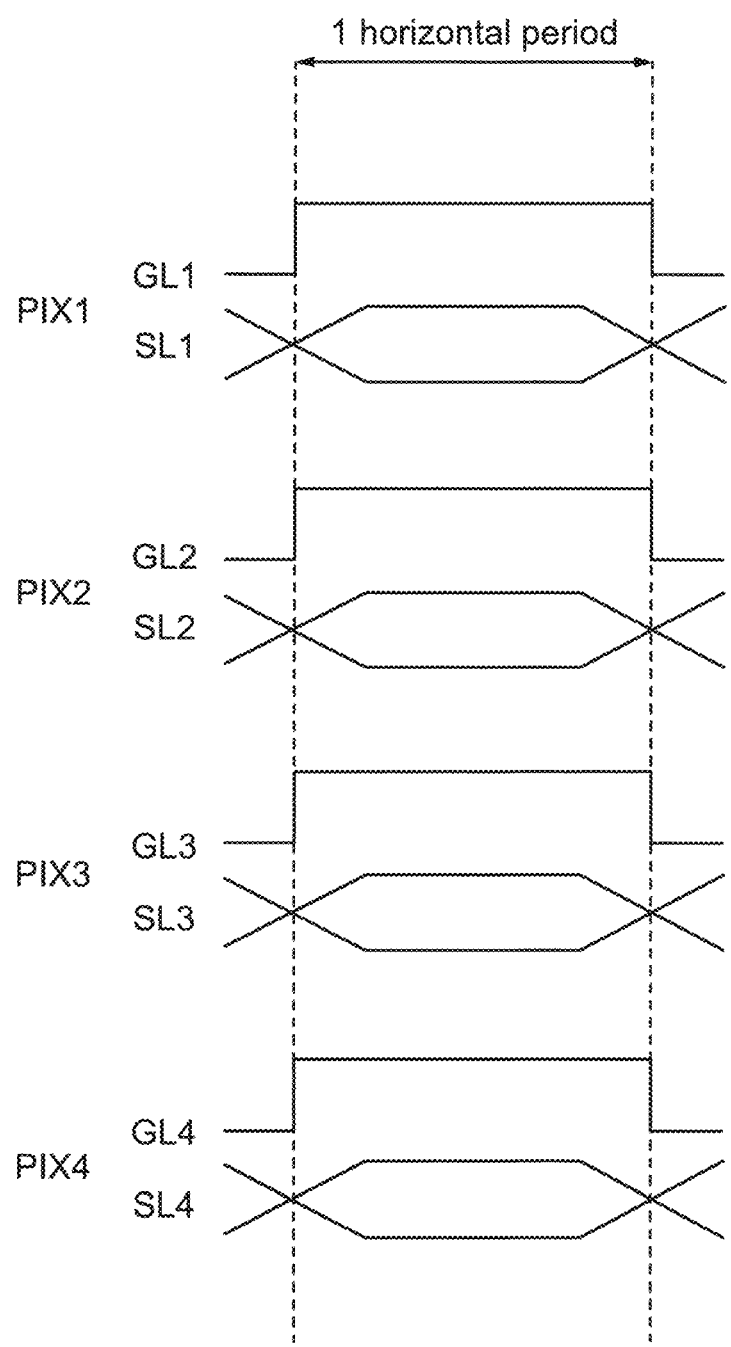
FIG. 6 is a timing chart of pixels in a display device according to an embodiment of the present invention.

FIG. 6 is a timing chart of the display device 10 according to an embodiment of the present invention. Normally, the gate wiring GL sequentially charges the pixel columns arranged in the direction D2 by using the same source wiring by supplying the on-voltage row by row. On the other hand, in the present embodiment, the on-voltage is simultaneously supplied to the four gate wirings GL, so that the transistors Tr of each of the four pixels are simultaneously turned on. In this state, the video signal is simultaneously supplied to the different source wirings SL1 to SL4. As a result, the four pixels arranged in the direction D2 can be driven simultaneously.

As shown in FIG. 5, the source wiring SL1 and the source wiring SL3, the source wiring SL2, and the source wiring SL4 are arranged so as to sandwich one column of pixels. In other words, the four source wirings SL1 to SL4 are arranged between one column of pixels and one column of pixels.

The source wiring SL1 and the source wiring SL3 have a region where they intersect. The source wiring SL2 and the source wiring SL4 have a region where they intersect. In other words, the source wiring SL1 and the source wiring SL3 are swapped, and the source wiring SL2 and the source wiring SL4 are swapped. As a result, resistance of the source wirings SL1 to SL4 and the uniformity of the capacitance can be achieved. In addition, it is possible to suppress a defect caused by static electricity at the time of manufacturing the display panel or the like. This reason for this will be described with reference to FIG. 7 to FIG. 11.

Planar Layout of Pixel

A planar layout of pixels PIX in the display device 10 according to an embodiment of the present invention will be described with reference to FIG. 7 to FIG. 11. FIG. 7 to FIG. 11 show a configuration in which a PIX-A1, a PIX-A2, a PIX-B1, and a PIX-B2 are in a plan view.

Figure 7:
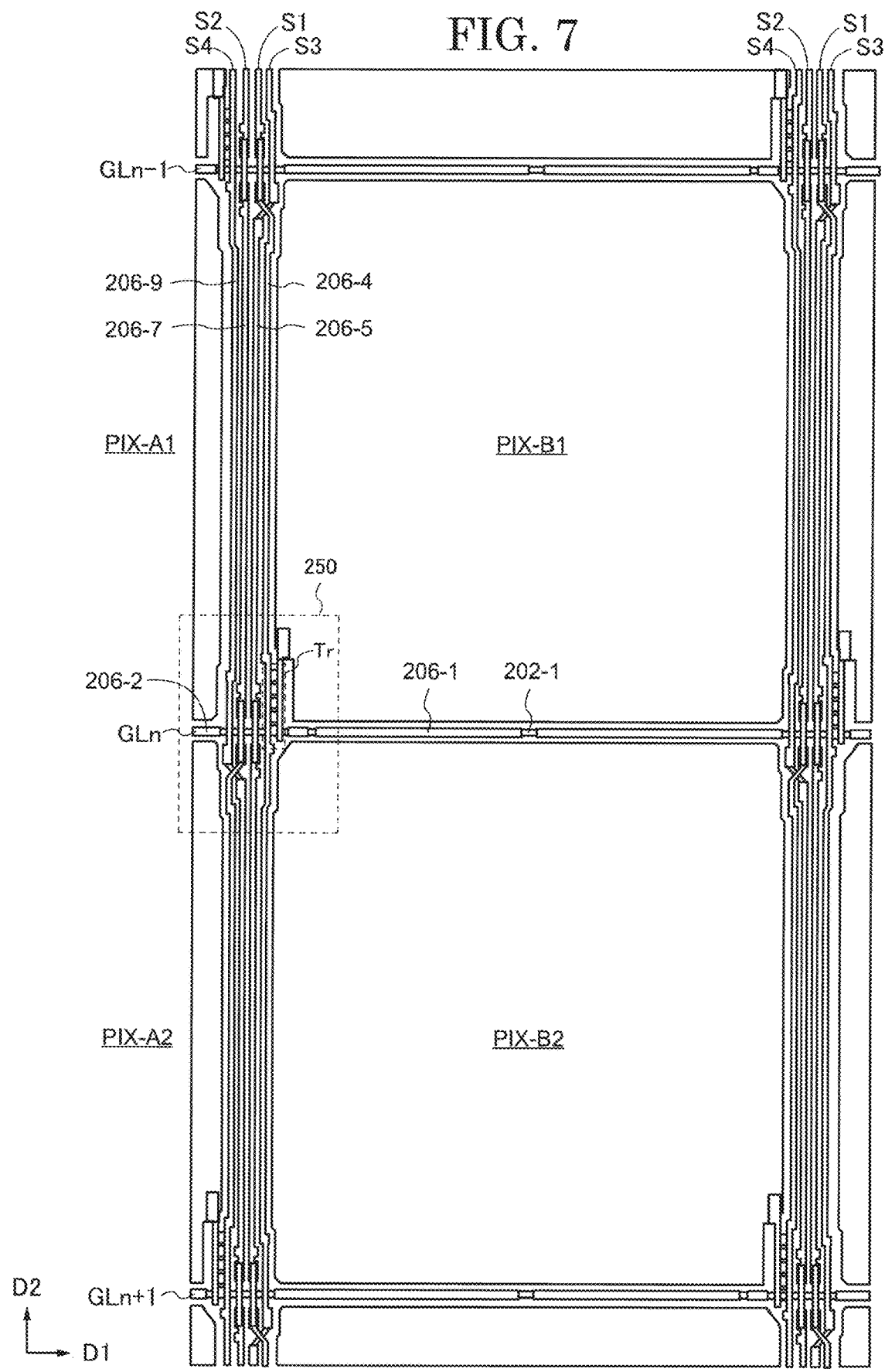
FIG. 7 is a planar layout of pixels in a display device according to an embodiment of the present invention.

As shown in FIG. 7, gate wirings GLn−1 to GLn+1 are arranged along the direction D1. In addition, source wirings S1 to S4 are arranged along the direction D2. In this case, an opening region of the pixel PIX-B1 is a region surrounded by the adjacent gate wiring GLn−1, the gate wiring GLn, the source wiring S3, and the source wiring S4. The pixel PIX-B1 is controlled by the transistor Tr arranged in a region 250.

In FIG. 8 to FIG. 11, configurations of the region where the source wiring SL1 and the source wiring SL3 intersect with each other and the region 250 where the source wiring SL2 and the source wiring SL4 intersect with each other will be described in detail.

Figure 8:
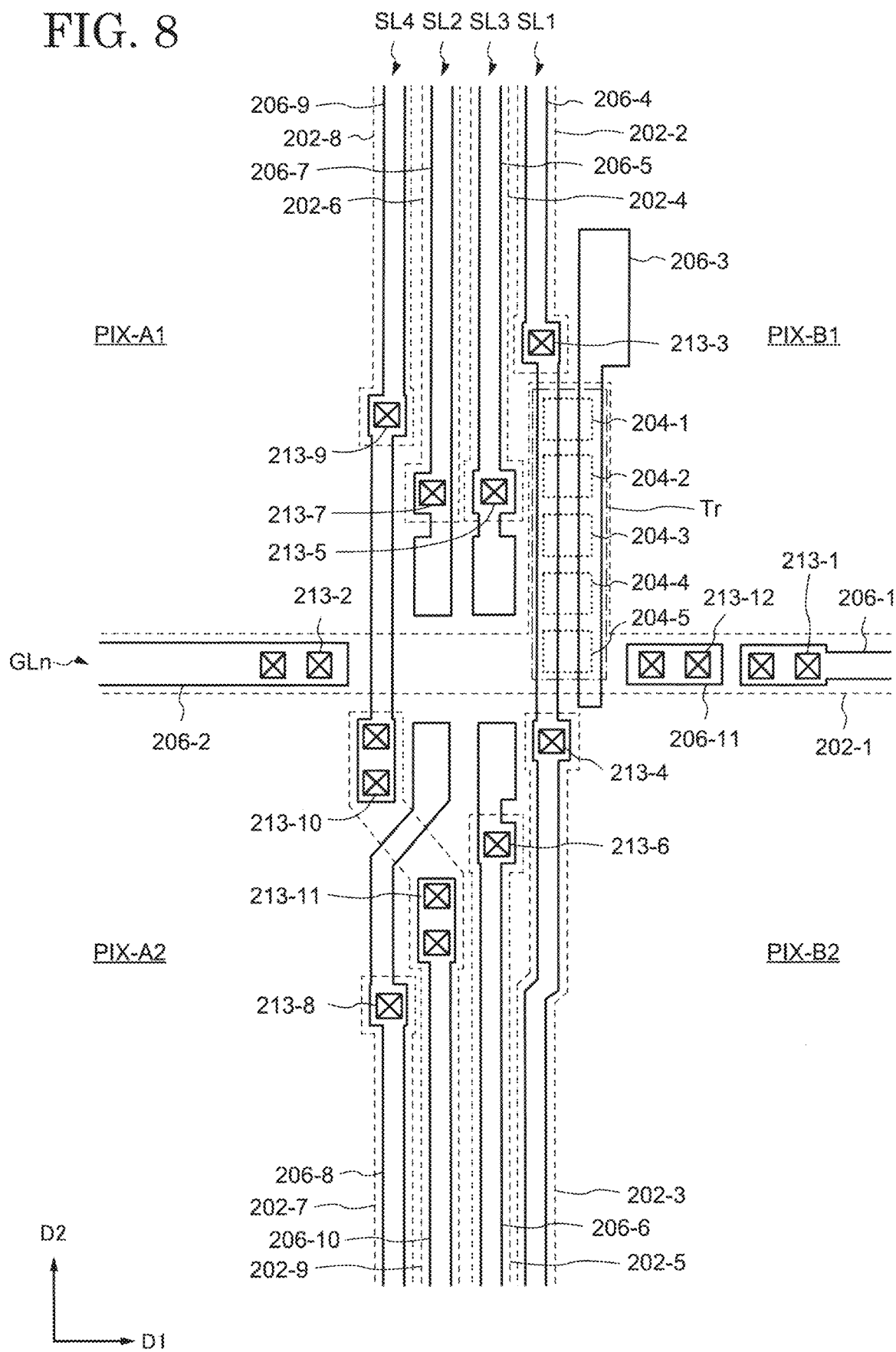
FIG. 8 is a planar layout of pixels in a display device according to an embodiment of the present invention.

FIG. 8 is a planar layout of the conductive layers 202-1 to 202-9, the oxide semiconductor layers 204-1 to 204-5, and conductive layers 206-1 to 206-11 in the region 250. The conductive layers 202-1 to 202-9 are arranged above the nitride insulating film 201. The conductive layer 202-1 has a region that extends in the direction D1 but branches in the direction D2. In addition, the conductive layers 202-2 to 202-9 extend in the direction D2. The oxide semiconductor layers 204-1 to 204-5 are arranged above the conductive layer 202-1 via the gate insulating film 203 (see FIG. 4). The oxide semiconductor layers 204-1 to 204-5 are arranged side by side in the direction D2. In the present embodiment, an example in which the five oxide semiconductor layers 204-1 to 204-5 are used to form the transistor Tr. The oxide semiconductor layers may be separately arranged in a plurality of layers to reduce the effect of heat generation. The number of oxide semiconductor layers is not particularly limited. In the oxide semiconductor layers 204-1 to 204-5, light guided from the conductive layer 202-1 side to the glass substrate (the array substrate 150) toward the oxide semiconductor layers 204-1 to 204-5 is reflected by the conductive layer 202-1, and light leakage is less likely to occur in the oxide semiconductor layers 204-1 to 204-5. The conductive layer 206-1 to 206-11 are arranged above the gate insulating film 203 and the oxide semiconductor layers 204-1 to 204-5. The conductive layers 206-1, 206-2, and 206-11 extend in the direction D1 and the conductive layers 206-3 to 206-10 extend in the direction D2.

The conductive layer 202-1 overlaps the conductive layers 206-1, 206-2, and 206-11. The conductive layer 202-1 is connected to the conductive layer 206-1 via an opening 213-1 arranged in the gate insulating film 203, and is connected to the conductive layer 206-2 via an opening 213-2 arranged in the gate insulating film 203. In the conductive layer 202-1, a region extending in the direction D1 functions as the gate wiring. In the conductive layer 202-1, a region extending in the direction D2 functions as the gate electrode. As described with reference to FIG. 4, the conductive layer 202 is constituted by a stacked layer of the first titanium layer 202a, the aluminum layer 202b, and the second titanium layer 202c, and the thickness of the second titanium layer 202c is larger than the thickness of the first titanium layer 202a. Therefore, at the time of forming the opening 213 in the gate insulating film 203, it is possible to suppress the second titanium layer 202c from being etched and the aluminum layer 202b is exposed.

The conductive layers 202-2 and 202-3 overlap the conductive layer 206-4. The conductive layer 202-2 is connected to the conductive layer 206-4 via an opening 213-3 arranged in the gate insulating film 203, and the conductive layer 202-3 is connected to the conductive layer 206-4 via an opening 213-4 arranged in the gate insulating film 203. The conductive layer 206-4 intersects the conductive layer 202-1. The conductive layer 206-4 functions as a first source wiring SL1. In addition, in the conductive layer 206-4, a region that does not overlap the conductive layers 202-2 and 202-3 functions as a source electrode of the transistor Tr. The conductive layer 206-3 functions as a drain electrode of the transistor Tr.

The conductive layer 202-4 overlaps the conductive layer 206-5 and is connected to the conductive layer 206-5 via an opening 213-5 arranged in the gate insulating film 203. The conductive layer 202-5 overlaps the conductive layer 206-6 and is connected to the conductive layer 206-6 via an opening 213-6 arranged in the gate insulating film 203. The conductive layer 206-5 is connected to the conductive layer 206-6 via a conductive layer 208-2 (see FIG. 9). As a result, the conductive layer 206-5, the conductive layer 206-6, and the conductive layer 208-2 function as a third source wiring SL3.

The conductive layer 202-6 overlaps the conductive layer 206-7 and is connected to the conductive layer 206-7 via an opening 213-7 arranged in the gate insulating film 203. The conductive layer 202-7 overlaps the conductive layer 206-8 and is connected to the conductive layer 206-8 via an opening 213-8 arranged in the gate insulating film 203. The conductive layer 206-7 is connected to the conductive layer 206-8 via a conductive layer 208-3 (see FIG. 9). The conductive layer 206-7, the conductive layer 206-8, and the conductive layer 208-3 function as a second source wiring SL2.

The conductive layer 202-8 overlaps the conductive layer 206-9 and is connected to the conductive layer 206-9 via an opening 213-9 arranged in the gate insulating film 203. The conductive layer 202-9 overlaps the conductive layer 206-9 and conductive layer 206-10. The conductive layer 202-9 is connected to the conductive layer 206-9 via an opening 213-10 arranged in the gate insulating film 203. The conductive layer 202-9 is connected to the conductive layer 206-10 via an opening 213-11 arranged in the gate insulating film 203. The conductive layer 206-9 has a region that intersects the conductive layer 202-1. The conductive layer 206-9 and the conductive layer 206-10 function as a fourth source wiring SL4.

In addition, the conductive layer 202-1 overlaps the conductive layer 206-11 and is connected to the conductive layer 206-11 via an opening 213-12 arranged in the gate insulating film 203.

The conductive layer 202-9 and the conductive layer 206-8 have a bent region. The conductive layer 202-9 has a region that overlaps and intersects the conductive layer 206-8. That is, the second source wiring SL2 and the fourth source wiring SL4 have a region intersecting each other.

Although not shown, the conductive layer 202-2 and the conductive layer 206-5 have a bent region. The conductive layer 202-2 has a region that overlaps and intersects the conductive layer 206-5. That is, the first source wiring SL1 has a region that intersects the third source wiring SL3.

As shown in FIG. 7, the gate wiring GLn is formed by stacking the conductive layer 202-1 and conductive layers 206-1 and 206-2. The conductive layer 202-1 extends along the direction D1. In the gate wiring GLn, in a region that intersects the source wiring SL1 to the source wiring SL4, only the conductive layer 202-1 is arranged, and the conductive layer 206-1 and the conductive layer 206-2 are arranged separate from each other. In addition, as shown in FIG. 8, the source wiring SL1 is formed by stacking the conductive layers 202-2 and 202-3 and the conductive layer 206-4. In the source wiring SL1, in a region that intersects the gate wiring GLn, only the conductive layer 206-4 is arranged, and the conductive layer 202-2 and the conductive layer 202-3 are arranged separate from each other. As a result, even if static electricity is generated in the manufacturing process of the display region 12 and the peripheral region 14 in the array substrate 150, the static electricity can be released, and the generation of defects caused by the static electricity can be suppressed.

Figure 9:
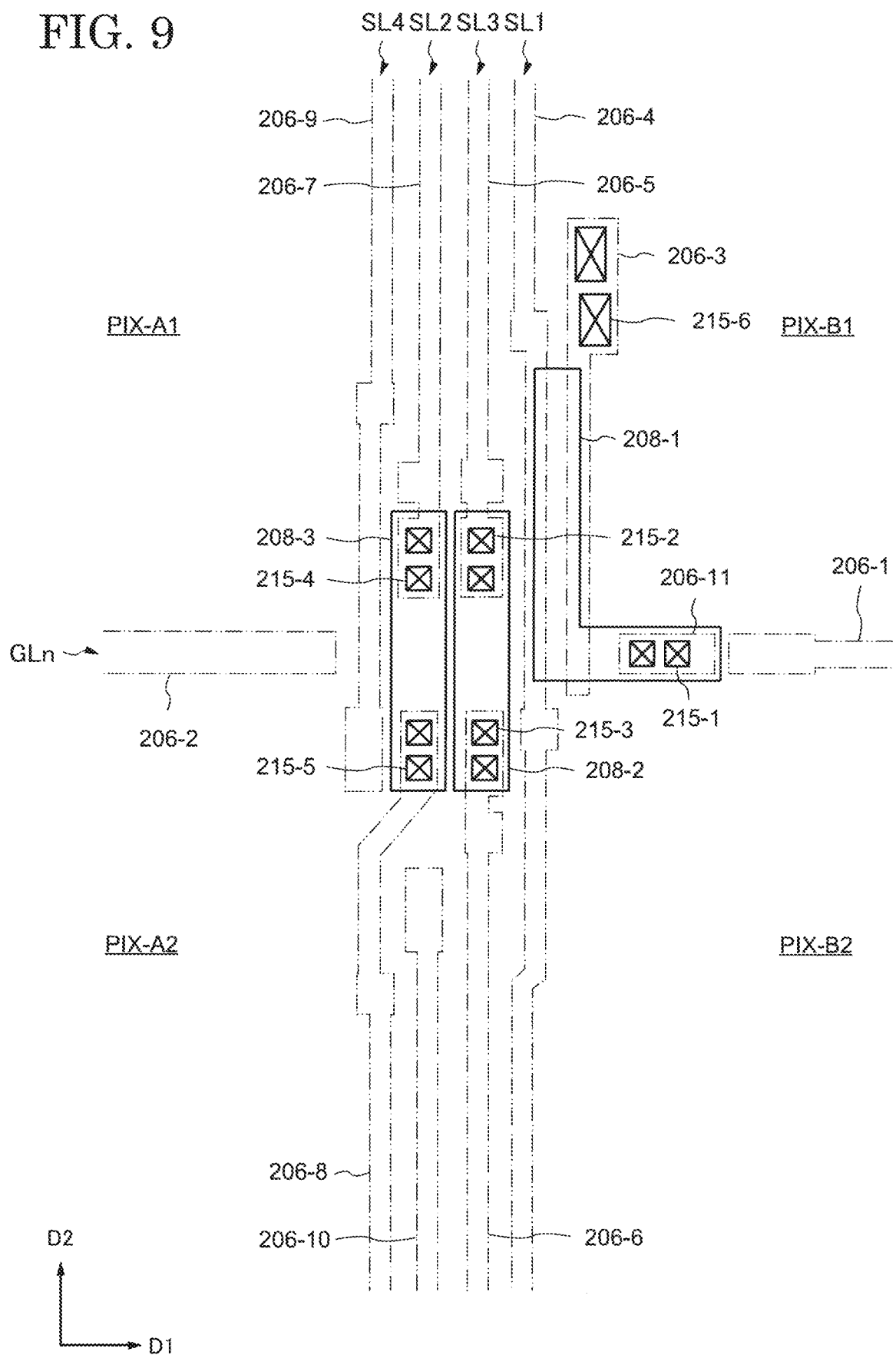
FIG. 9 is a planar layout of pixels in a display device according to an embodiment of the present invention.

FIG. 9 is a planar layout of the conductive layers 206-1 to 206-11 and the conductive layers 208-1 to 208-3 in the region 250. The conductive layers 206-1 to 206-11 are as described in FIG. 8. The conductive layers 208-1 to 208-3 are arranged above the insulating film 205 (see FIG. 4). The conductive layer 208-1 has a region extending in the direction D2 and a region extending in the direction D1. The region extending in the direction D2 overlaps the oxide semiconductor layers 204-1 to 204-5. In addition, the region extending in the direction D1 overlaps the conductive layer 206-11 and is connected to the conductive layer 206-11 via an opening 215-1 arranged in the insulating film 205. The conductive layer 208-2 extends in the direction D2. The conductive layer 208-2 overlaps the conductive layer 206-5 and the conductive layer 206-6, and is connected to the conductive layer 206-5 and the conductive layer 206-6 via openings 215-2 and 215-3 arranged in the insulating film 205. The conductive layer 208-3 extends in the direction D2. The conductive layer 208-3 overlaps the conductive layer 206-7 and the conductive layer 206-8, and is connected to the conductive layer 206-7 and the conductive layer 206-8 via openings 215-4 and 215-5 arranged in the insulating film 205.

Figure 10:
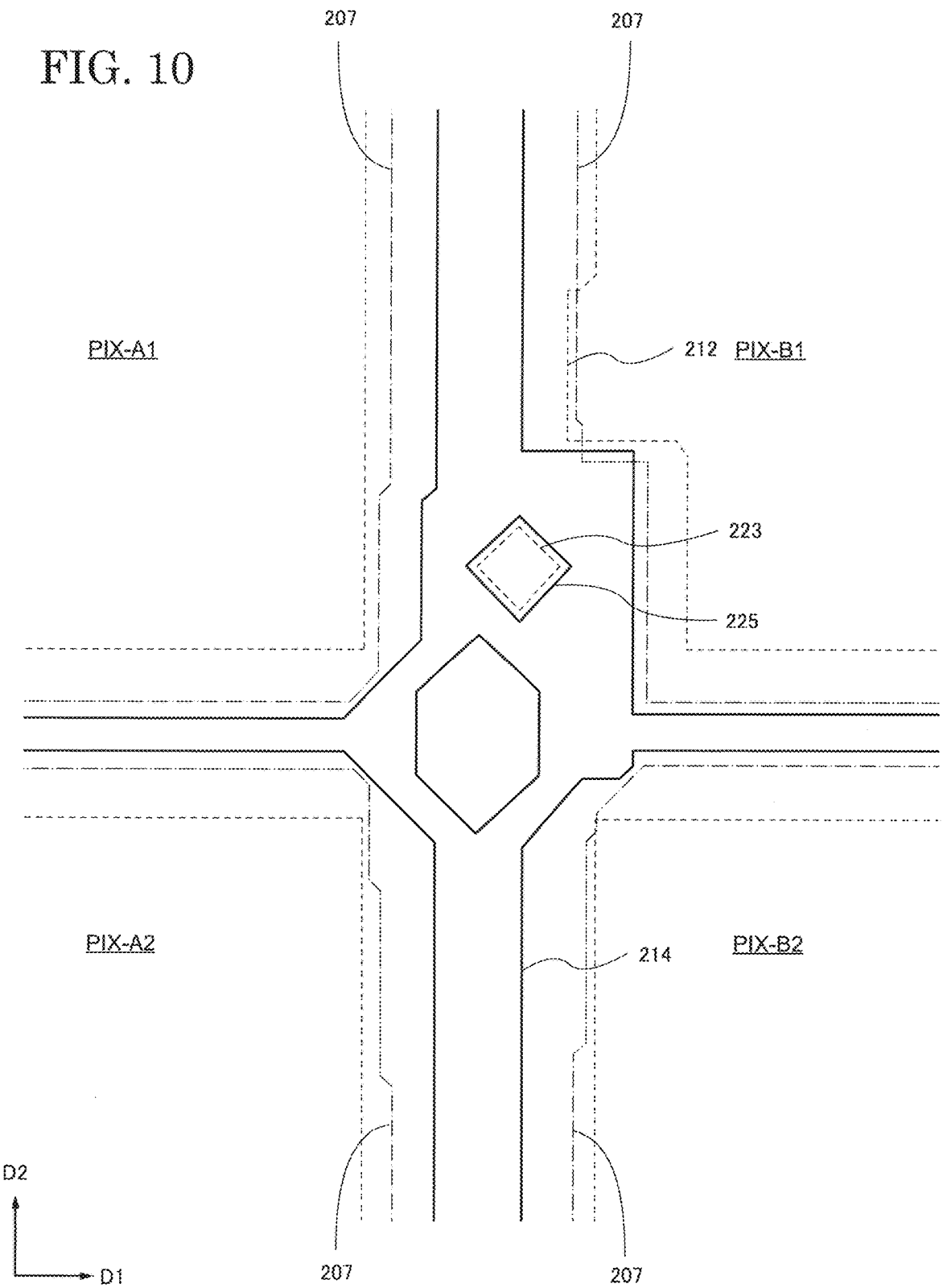
FIG. 10 is a planar layout of pixels in a display device according to an embodiment of the present invention.

FIG. 10 is a planar layout of the planarization film 207, the transparent conductive layer 212, and the conductive layer 214 in the region 250. The planarization film 207 has been removed in the opening regions of the pixels PIX1 to PIX4 as shown in FIG. 4. That is, the planarization film 207 is arranged above the wiring region. The transparent conductive layer 212 is arranged above the planarization 10 film 207. In addition, the conductive layer 214 is arranged above the transparent conductive layer 212. The transparent conductive layer 212 and the conductive layer 214 function as capacitive wirings. The transparent conductive layer 212 is arranged above the conductive layers 206-1 to 206-11 via the planarization film 207. Therefore, since the source wirings SL1 to SL4 and the capacitive wiring CW are arranged so as to be separated from each other, it is less likely to be affected by the potential from the capacitive wiring CW. In addition, the electrical resistance of the conductive layer 214 is smaller than the electrical resistance of the transparent conductive layer 212. Therefore, variation in the potential of the capacitive wiring CW due to the position where the pixel PIX is located in the display region 12 is suppressed. In addition, the transparent conductive layer 212 has an opening 223 and the conductive layer 214 has an opening 225. The opening 223 and the opening 225 are arranged so as to overlap each other.

The transparent conductive layer 212 and the conductive layer 214 are arranged in a grid pattern so as to cover the gate wiring GL and the source wirings SL1 to SL4. This reduces the holding capacity C between the region without the transparent conductive layer 212 and the pixel electrode 216. The holding capacity C is adjusted by the size of the region without the transparent conductive layer 212. In addition, the transparent conductive layer 212 may not be in the grid pattern, but may be arranged on the entire surface. In addition, the conductive layer 214 is arranged so as to cover the transistor Tr. As a result, optical leakage of the transistor Tr can be suppressed.

Although an example in which the conductive layer 214 is arranged above the transparent conductive layer 212 is shown, it may be arranged below the transparent conductive layer 212. The conductive layer 214 may be stacked with the transparent conductive layer 212. The conductive layer 214 has a light-shielding effect. Therefore, the wiring region can be shielded from light. A width of the conductive layer 214 is arranged so as to be larger than a combined width of the source wirings SL1 to SL4 in a plan view. In addition, the width of the conductive layer 214 is arranged so as to be larger than a width of the gating wiring GL in a plan view. As a result, it is possible to suppress a display panel 11 from emitting the reflected light reflected by the edges of the source wirings SL1 to SL4. In addition, the width of the conductive layer 214 and the combined width of the source wirings SL1 to SL4 refer to lengths in a direction (the direction D2) intersecting the direction in which the source wirings SL1 to SL4 extend. Further, the width of the gate wiring GL refers to a length in a direction (the direction D2) intersecting the direction in which the gate wiring GL extends.

Figure 11:
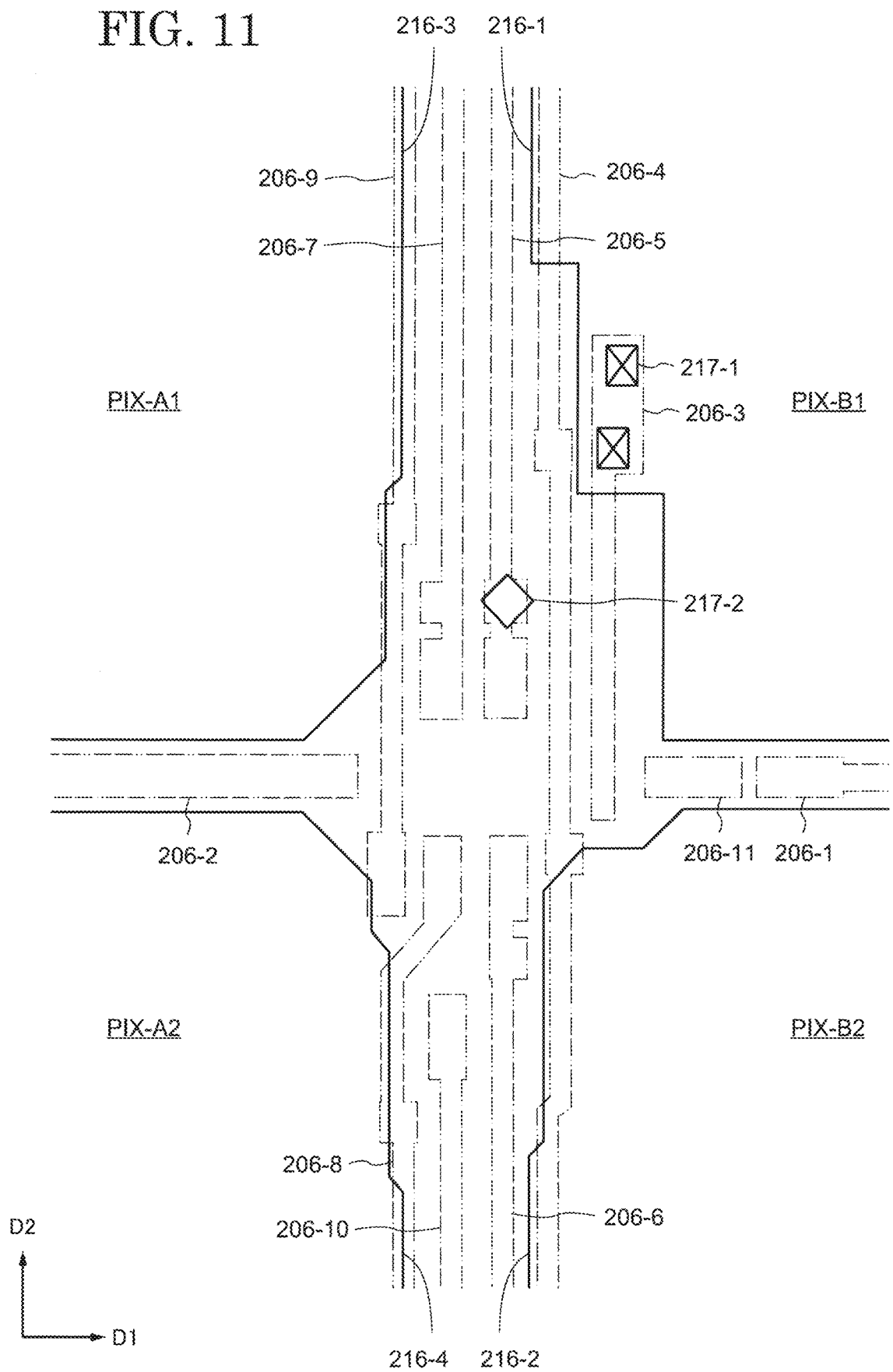
FIG. 11 is a planar layout of pixels in a display device according to an embodiment of the present invention.

FIG. 11 is a planar layout of the conductive layers 206-1 to 206-11 and the pixel electrodes 216-1 to 216-4 in the region 250. The conductive layers 206-1 to 206-11 are as described in FIG. 8. The pixel electrodes 216-1 to 216-4 are arranged above the insulating film 209. The pixel electrodes 216-1 to 216-4 are arranged in the opening region of the pixel PIX. The pixel electrode 216-1 is connected to the conductive layer 206-3 via an opening 217-1 arranged in the insulating film 209 and an opening 215-6 (see FIG. 9) arranged in the insulating film 205. In addition, the insulating film 209 has an opening 217-2. The opening 217-2 is arranged so as to overlap the opening 223 and the opening 225. Since the openings 223, 225, and 217-2 are arranged so as to overlap each other above the planarization film 207, water contained in the planarization film 207 can be discharged via the openings 223, 225, and 217-2.

As described above, in the display region 12, the conductive layer 202 and the conductive layer 206 are arranged so as to be stacked on each other and extend as the gate wirings GL1 to GL4 and the source wirings SL1 to SL4. Since the source wirings SL1 to SL4 are arranged so that the conductive layer 202 and the conductive layer 206 are stacked and extended, resistance of the source wirings SL1 to SL4 can be made uniform and wiring capacitance can be made uniform. In addition, the source wiring SL1 and the source wiring SL3 can be arranged to intersect each other, and the source wiring SL2 and the source wiring SL4 can be arranged to intersect each other.

Example 1

In the present example, a result of verifying the surface unevenness and the shape of the end portion of the gate electrode in the relationship between the surface forming the gate electrode and the stacked structure of the gate electrode will be described.

First, a sample for forming the gate electrode on the glass substrate will be described.

Sample A

A 240 nm aluminum layer and a 150 nm titanium layer were stacked on the glass substrate. Thereafter, the aluminum layer and the titanium layer were processed in a patterned shape using a $Cl_2$, $BCl_3$, and $N_2$ mixed gas in an inductively coupled plasma method. In all subsequent samples, the aluminum layer and the titanium layer are processed in a patterned shape under the same etching condition.

Sample B

A 240 nm aluminum layer and a 50 nm titanium layer were stacked on the glass substrate. Thereafter, the aluminum layer and the titanium layer were processed in a patterned shape.

Sample C

A 10 nm titanium layer, a 240 nm aluminum layer, and a 50 nm titanium layer were stacked on the glass substrate. Thereafter, the titanium layer, the aluminum layer, and the titanium layer were processed in a patterned shape.

Next, a sample for forming the gate electrode above the 50 nm oxide silicon film arranged above the glass substrate will be described.

Sample D

A 240 nm aluminum layer and a 150 nm titanium layer were stacked on the silicon oxide film. Thereafter, the aluminum layer and the titanium layer were processed in a patterned shape.

Sample E

A 240 nm aluminum layer and a 50 nm titanium layer were stacked on the silicon oxide film. Thereafter, the aluminum layer and the titanium layer were processed in a patterned shape.

Sample F

A 10 nm titanium layer, a 240 nm aluminum layer, and a 50 nm titanium layer were stacked on the silicon oxide film. Thereafter, the titanium layer, the aluminum layer, and the titanium layer were processed in a patterned shape.

Next, a sample for forming the gate electrode on the 50 nm silicon nitride film arranged above the glass substrate will be described.

Sample G

A 240 nm aluminum layer and a 150 nm titanium layer were stacked on the silicon nitride film. Thereafter, the aluminum layer and the titanium layer were processed in a patterned shape.

Sample H

A 240 nm aluminum layer and a 50 nm titanium layer were stacked on the silicon nitride film. Thereafter, the aluminum layer and the titanium layer were processed in a patterned shape.

Sample I

A 10 nm titanium layer, a 240 nm aluminum layer, and a 50 nm titanium layer were stacked on the silicon nitride film. Thereafter, the titanium layer, the aluminum layer, and the titanium layer were processed in a patterned shape.

For each sample processed in a patterned shape, a SEM image was imaged by a scanning electron microscope (SEM). FIG. 12 is SEM photographs obtained by observing the surface unevenness of the gate electrodes and the shapes of end portions for each of the samples A to I.

The samples A, D, and G in which the pattern was formed by stacking the 240 nm aluminum layer and the 50 nm titanium layer, all had unevenness on the surface of the pattern, and sword-like unevenness was confirmed in the end portion of the pattern. The samples B, E, and H, in which the pattern was formed by stacking the 240 nm aluminum layer and the 50 nm titanium layer, all had unevenness on the surface of the pattern, but the sword-like residue in the pattern end was improved. In particular, the pattern end of the sample H patterned on the silicon nitride film has a very smooth shape. In the sample C, sample F, and sample I, in which the pattern was formed by stacking the 10 nm titanium layer, the 240 nm aluminum layer, and the 50 nm titanium layer, all the pattern ends had sword-like unevenness, but in the sample C patterned on the glass substrate and the sample I patterned on the silicon nitride film, unevenness on the pattern surface were improved.

Example 2

In the present example, a result of verifying the surface unevenness and the shape of the end portion by changing the conditions of the stacked structure of the gate electrode will be described.

Sample J

A 240 nm aluminum layer (Al) and a 150 nm titanium layer (T-Ti) were stacked on the glass substrate. Thereafter, the aluminum layer and the titanium layer were processed in a patterned shape.

Sample K

A 10 nm titanium layer (B—Ti), a 240 nm aluminum layer (Al), and a 150 nm titanium layer (T-Ti) were stacked on the glass substrate. Thereafter, the titanium layer, the aluminum layer, and the titanium layer were processed in a patterned shape.

Sample L

A 240 nm aluminum layer (Al) and a 50 nm titanium layer (T-Ti) were stacked on the glass substrate. Thereafter, the aluminum layer and the titanium layer were processed in a patterned shape.

Sample M

A 10 nm titanium layer (B—Ti), a 240 nm aluminum layer (Al), and a 50 nm titanium layer (T-Ti) were stacked on the glass substrate. Thereafter, the aluminum layer and the titanium layer were processed in a patterned shape.

Figure 13:
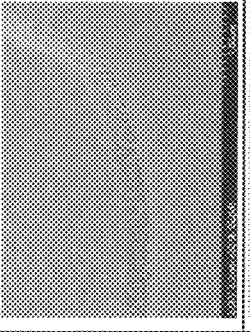
FIG. 13 are SEM photographs obtained by observing surface unevenness of gate electrodes and the shapes of end portions for each of Samples J to M.
Figure 13:
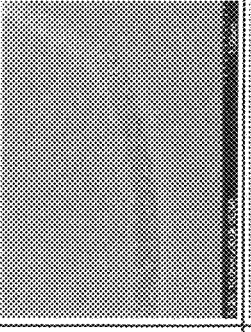
Figure 13:
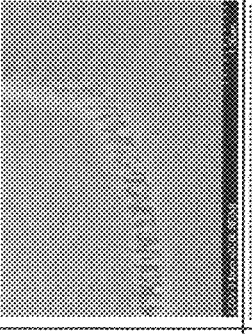
Figure 13:
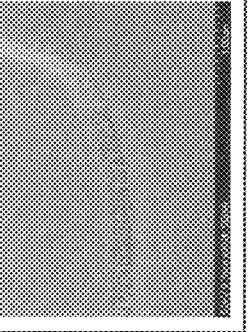
Figure 13:
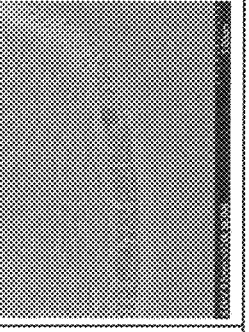
Figure 13:
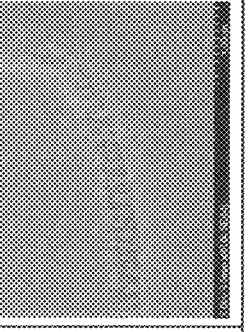

For each sample processed in a pattered shape, a SEM image was imaged by the scanning electron-microscope (SEM). FIG. 13 are SEM photographs obtained by observing the surface unevenness of the gate electrodes and the shapes of end portions for each of the samples J to M. In each of the samples J to M, SEM observations were performed at both the center and the end of substrate.

For the sample J, unevenness occurred on the surface of the pattern, and the etching residue of the end portion of the pattern did not improve. For the sample K, the surface unevenness of the pattern improved, but the etching residue of the end portion of the pattern did not improve. For the sample L, unevenness occurred on the surface of the pattern, but the etching residue of the end portion of the pattern improved. In addition, for the sample M, both the surface unevenness of the pattern and the etching residue of the end portion of the pattern were improved.

Example 3

Next, in the present example, results of an optical simulation of chromaticity variation under different conditions for the thickness of the insulating film will be described.

Figure 14:
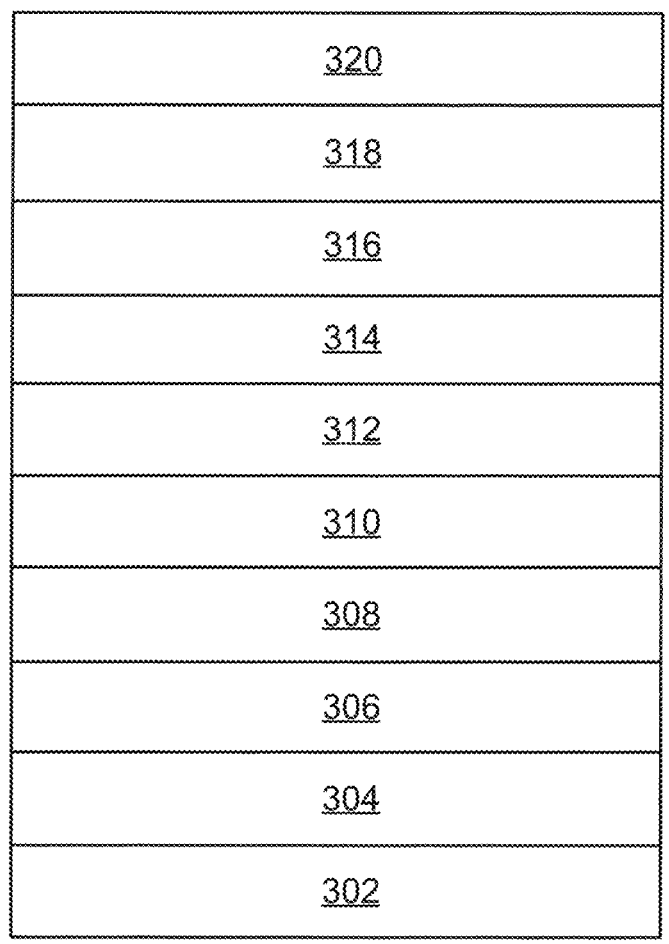
FIG. 14 is a model diagram of an optical simulation according to the present embodiment.
Figure 15:
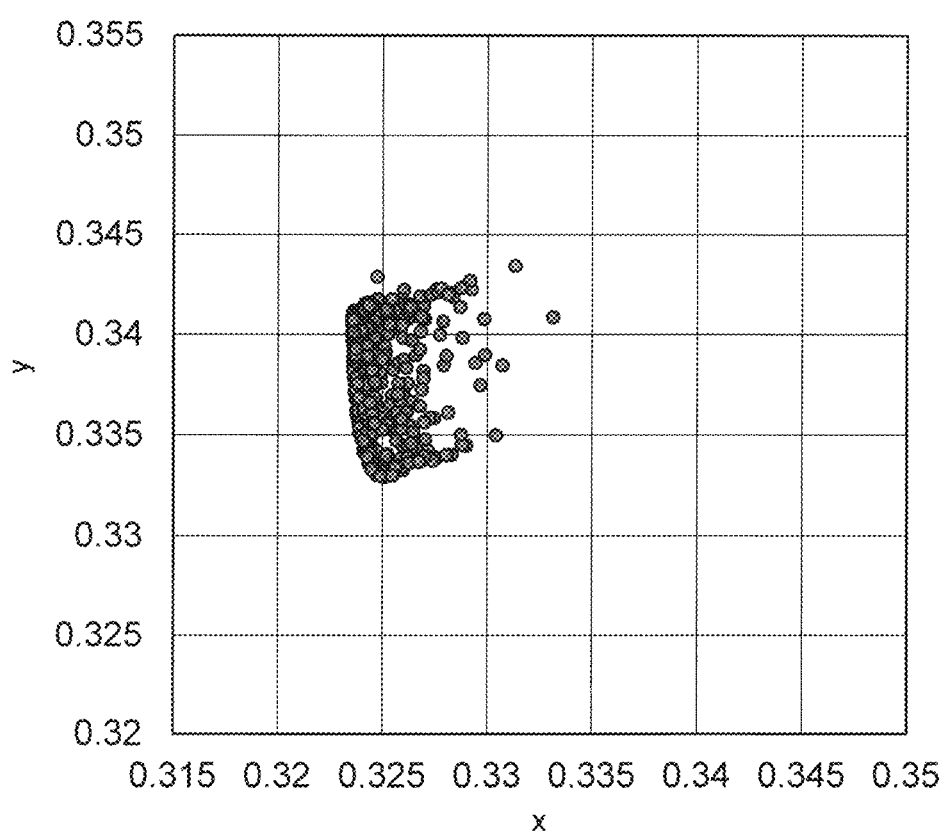
FIG. 15 is an xy chromaticity diagram obtained by optical simulation in the present embodiment.
Figure 16:
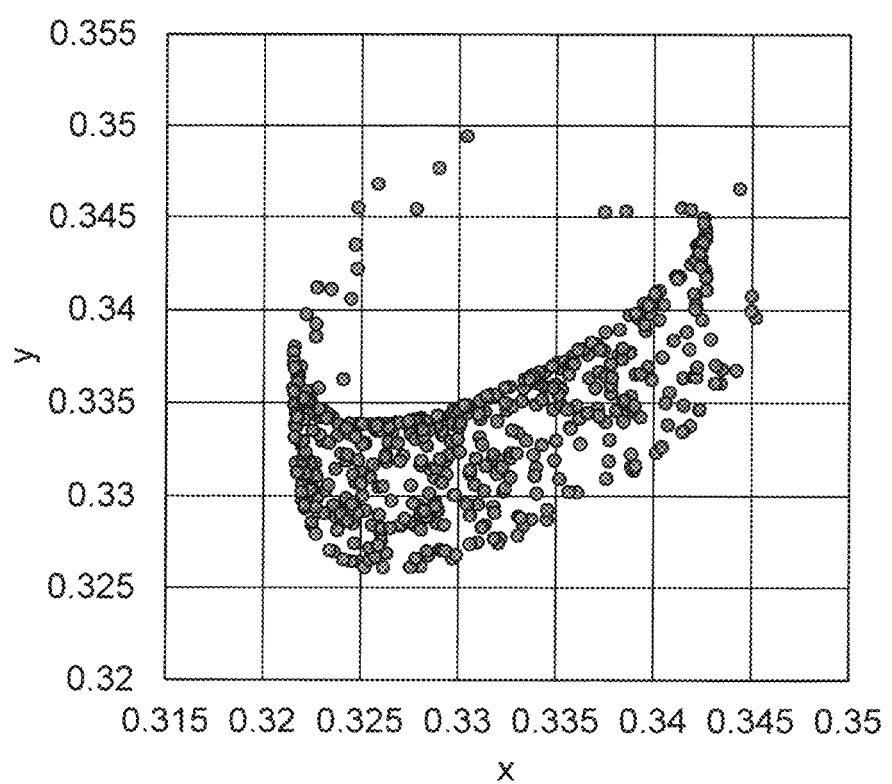
FIG. 16 is an xy chromaticity diagram obtained by optical simulation in the present embodiment.
Figure 17:
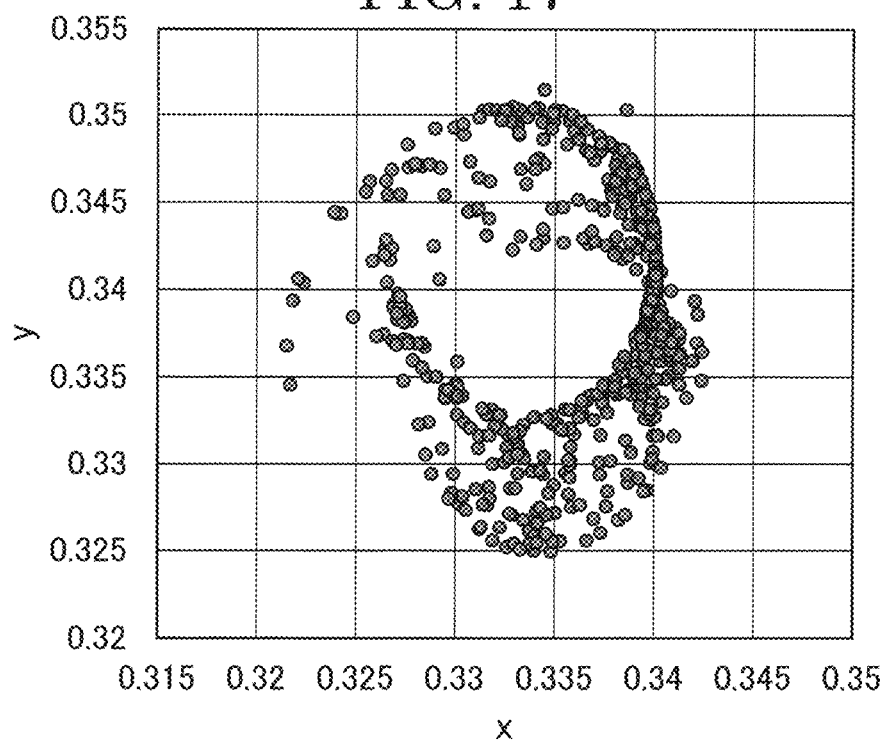
FIG. 17 is an xy chromaticity diagram obtained by optical simulation in the present embodiment.
Figure 18:
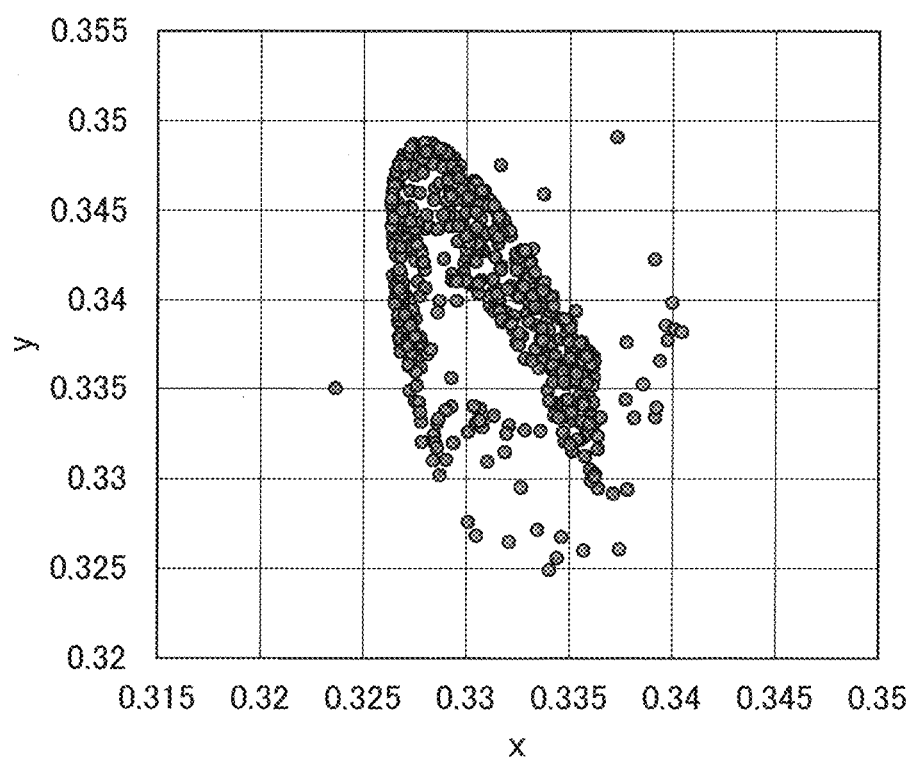
FIG. 18 is an xy chromaticity diagram obtained by optical simulation in the present embodiment.
Figure 19:
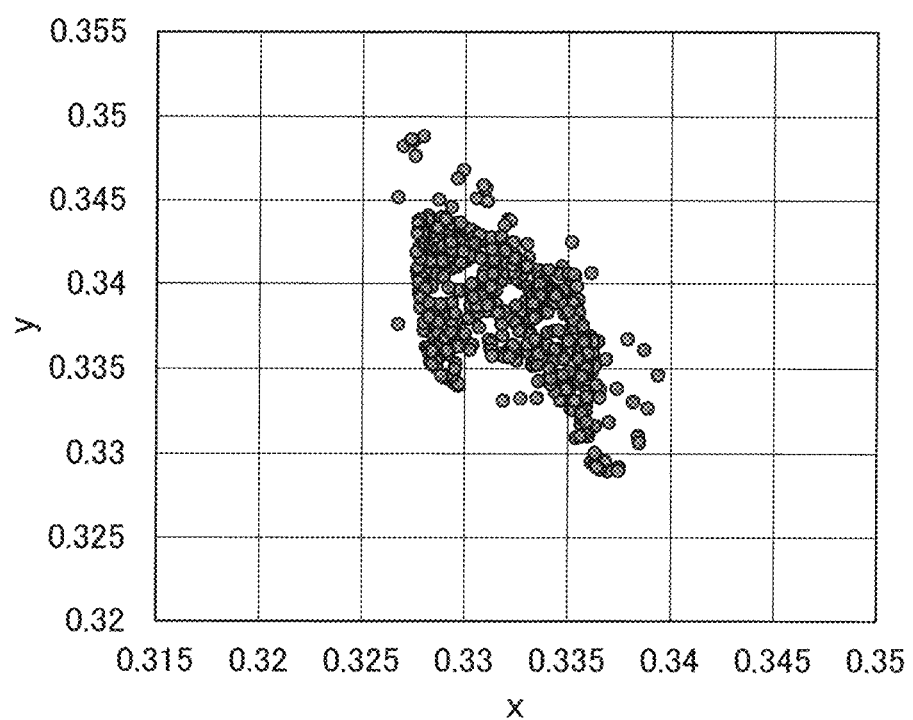
FIG. 19 is an xy chromaticity diagram obtained by optical simulation in the present embodiment.
Figure 20:
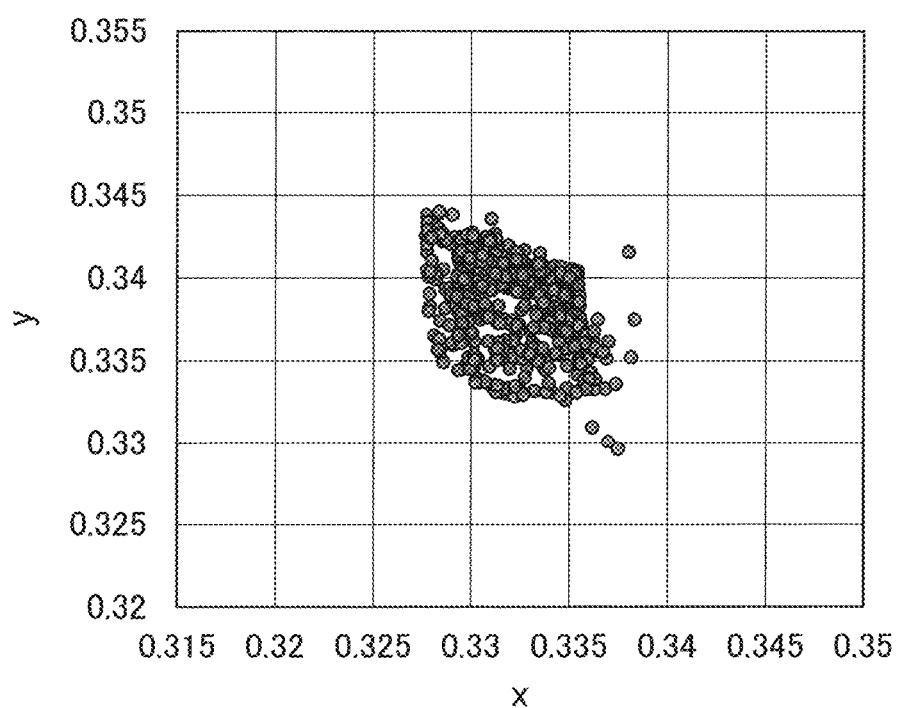
FIG. 20 is an xy chromaticity diagram obtained by optical simulation in the present embodiment.
Figure 21:
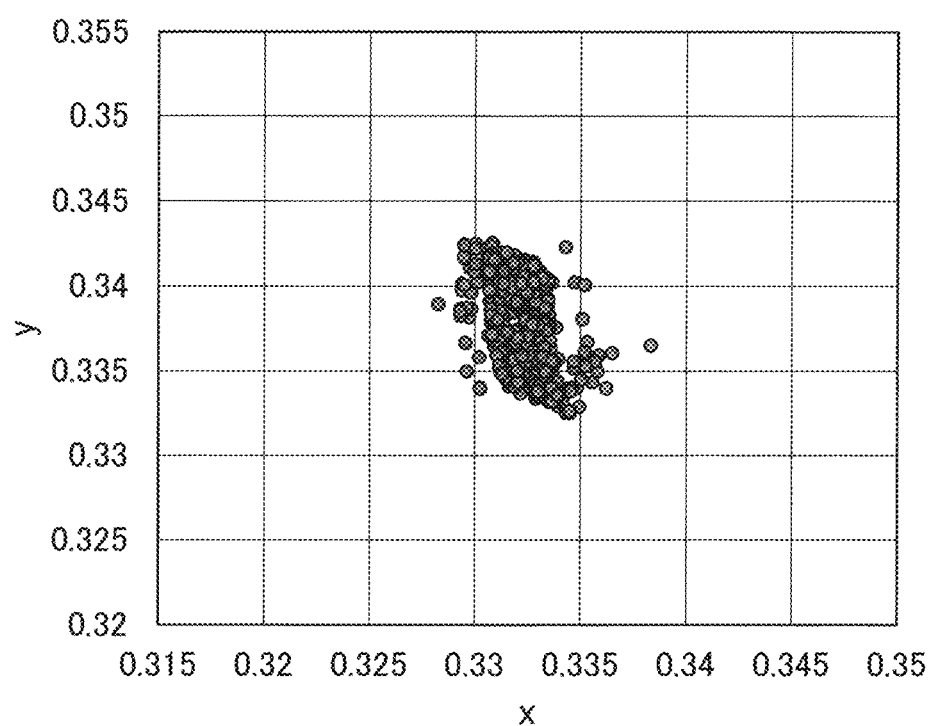
FIG. 21 is an xy chromaticity diagram obtained by optical simulation in the present embodiment.
Figure 22:
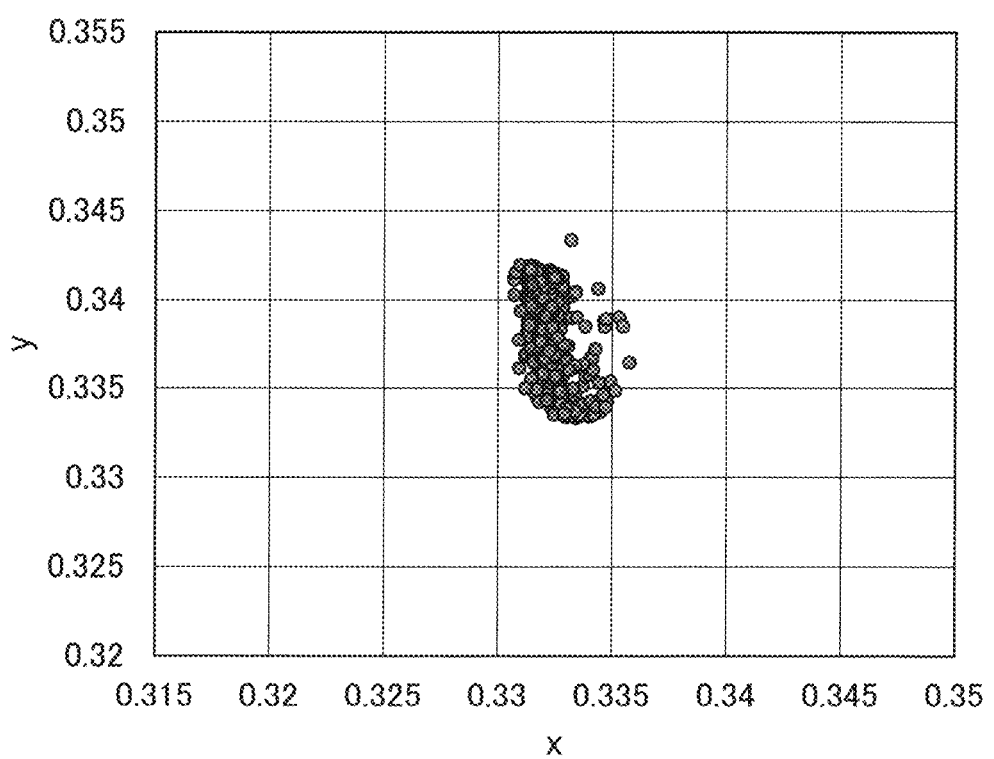
FIG. 22 is an xy chromaticity diagram obtained by optical simulation in the present embodiment.

First, a model of the optical simulation used in the present example will be described. FIG. 14 is a model diagram of the optical simulation. As shown in FIG. 14, silicon nitride 304, silicon oxide 306, silicon oxide 308, silicon nitride 310, silicon nitride 312, an ITO 314, a liquid crystal 316, an ITO 318, and a glass 320 are stacked in this order above a glass 302. In this case, the silicon nitride 304 and the silicon oxide 306 correspond to the gate insulating film 203, the silicon oxide 308 and the silicon nitride 310 correspond to the insulating film 205, the silicon nitride 312 corresponds to the insulating film 209, the ITO 314 corresponds to the pixel electrode 216, the liquid crystal 316 corresponds to the liquid crystal, the ITO 318 corresponds to the common electrode 218, and the glass 320 corresponds to the counter substrate.

For the thickness of each layer used in the simulation, the thicknesses of the silicon oxide 306 was 200 nm, the silicon oxide 308 was 300 nm, the silicon nitride 310 was 100 nm, the silicon nitride 312 was 220 nm, the ITO 314 was 50 nm, the liquid crystal 316 was 3150 nm, and the ITO 318 was 35 nm. In this case, the thickness of the silicon nitride 304 was set to 100 nm, 200 nm, 300 nm, 400 nm, 500 nm, 600 nm, 800 nm, and 1000 nm. In addition, calculations were performed assuming that the thickness of the silicon nitride 304 varies within the plane by ±10%.

In order to confirm the chromaticity variation in the opening region of the plurality of pixels PIX, the optical simulation for calculating chromaticity was performed using a transfer matrix method.

FIG. 15 to FIG. 22 are xy chromaticity diagrams obtained by the optical simulation, and FIG. 15, FIG. 16, FIG. 17, FIG. 18, FIG. 19, FIG. 20, FIG. 21, and FIG. 22 are xy chromaticity diagrams in the case where the thickness of the silicon nitride 304 is 100 nm, 200 nm, 300 nm, 400 nm, 500 nm, 600 nm, 800 nm, and 1000 nm. FIG. 15 to FIG. 22 are enlarged views of a region where x is 0.315 to 0.35 and y is 0.32 to 0.355 in an xy chromaticity diagram of CIE1931 color space. The region where x is 0.315 to 0.35 and y is 0.32 to 0.355 is a region near a white point (0.33, 0.33). In addition, the number of plots is 500.

As shown in FIG. 16 to FIG. 19, it was shown that chromaticity varies in a range where the thickness of the silicon nitride film is 200 nm or more and 500 nm or less. On the other hand, it was shown that in the case where the thickness of the silicon nitride of the gate insulating film is 600 nm or more and 1000 nm or less, variations in chromaticity are suppressed.

As described in the first embodiment, the thickness of the nitride insulating film used as part of the gate insulating film is limited. In the case where the thickness of the nitride insulating film used as part of the gate insulating film is 200 nm or more and 400 nm or less, it is suggested that the variation in chromaticity in the display device can be reduced by setting the nitride insulating film functioning as the base film to 200 nm or more and 800 nm or less.

For comparative purposes, in FIG. 14, the thickness of the gate insulating film was 300 nm, and the total thickness of the silicon nitride 310 and the silicon nitride 312 was set to 320 nm, 500 nm, and 700 nm. In order to confirm the chromaticity variation in the opening region of the plurality of pixels PIX according to the total thickness of the silicon nitride 310 and the silicon nitride 312, the optical simulation for calculating chromaticity was performed using the transfer matrix method.

Figure 23:
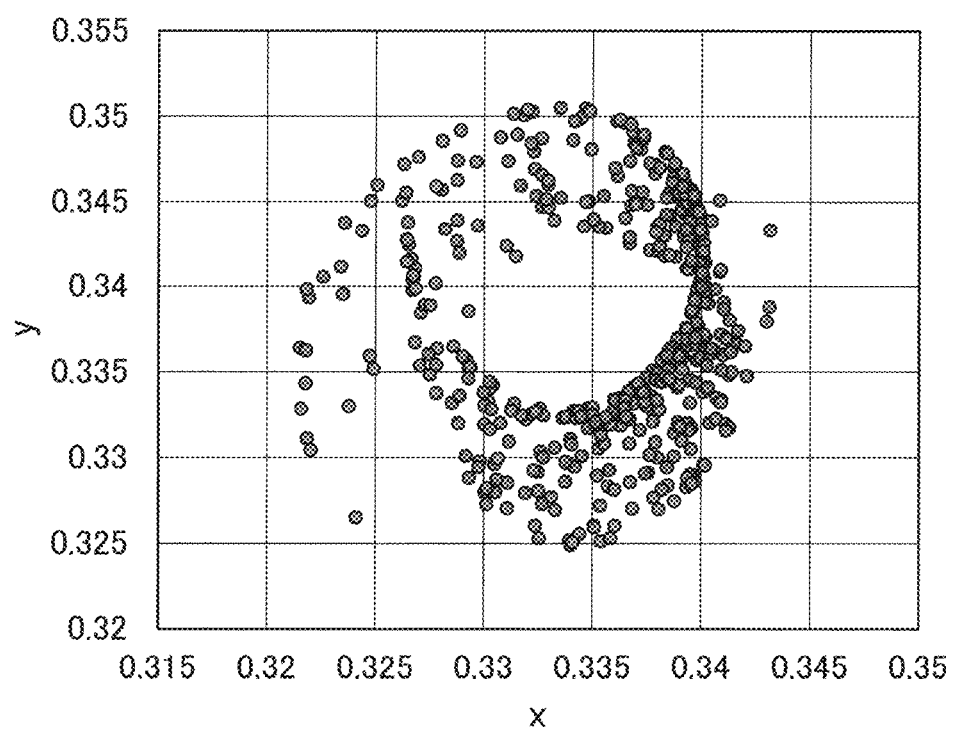
FIG. 23 is an xy chromaticity diagram obtained by optical simulation in the present embodiment.
Figure 24:
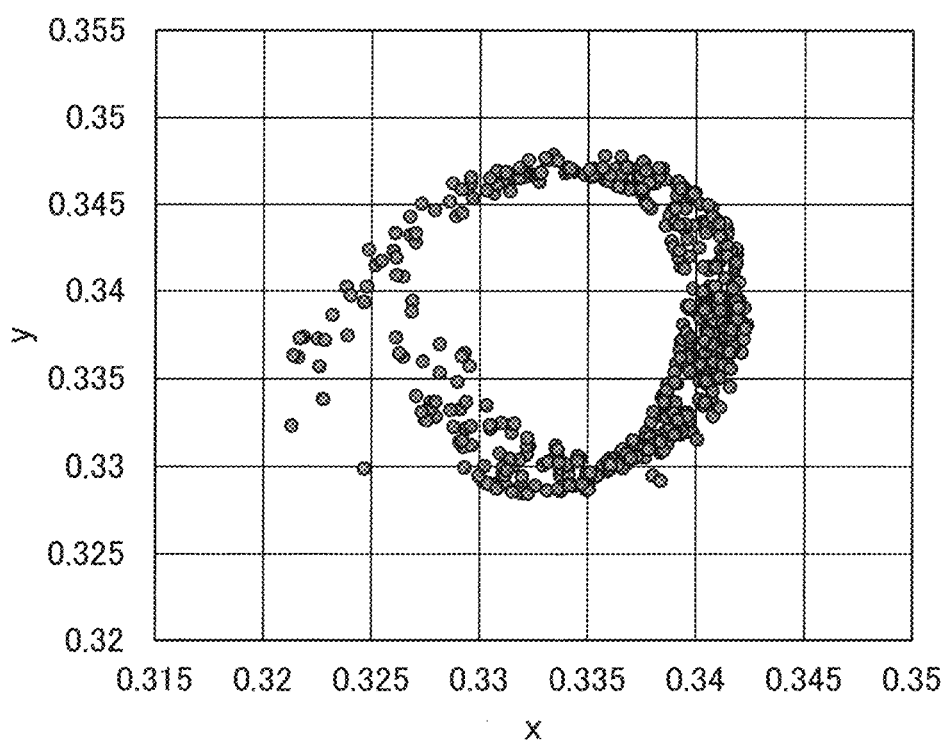
FIG. 24 is an xy chromaticity diagram obtained by optical simulation in the present embodiment.
Figure 25:
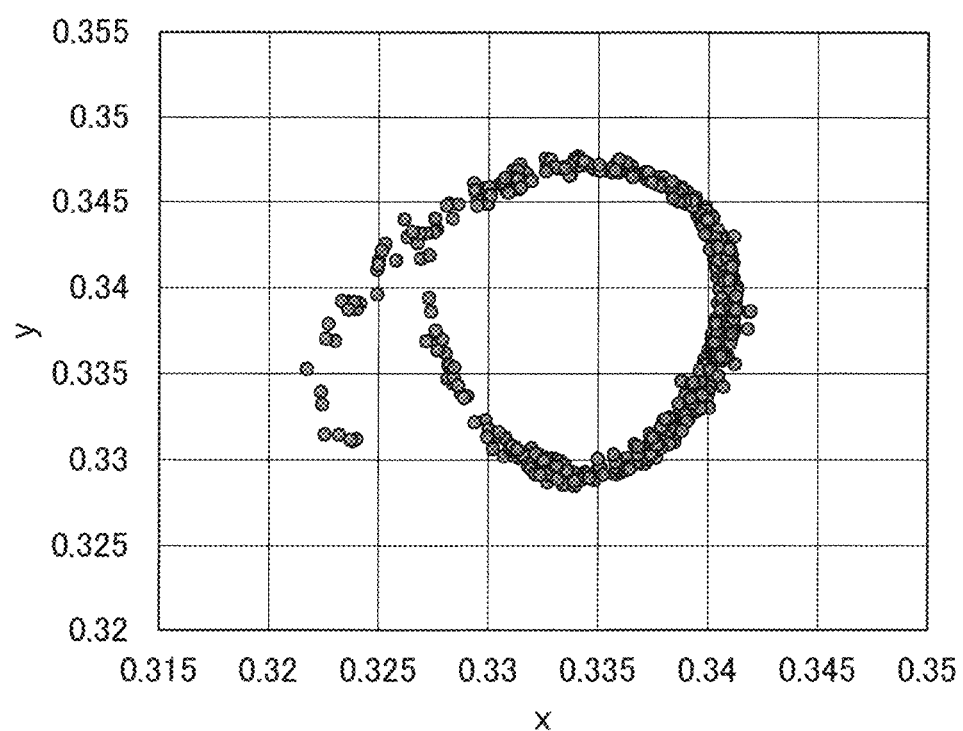
FIG. 25 is an xy chromaticity diagram obtained by optical simulation in the present embodiment.

FIG. 23 to FIG. 25 are xy chromaticity diagrams obtained by the optical simulation, and FIG. 23, FIG. 24, and FIG. 25 are xy chromaticity diagrams in the case where the total thickness of the silicon nitride 310 and the silicon nitride 312 are 320 nm, 500 nm, and 700 nm, respectively. FIG. 23 to FIG. 25 are enlarged views of the region where x is 0.315 to 0.35 and y is 0.32 to 0.355 in the xy chromaticity diagram of CIE1931 color space. The region where x is 0.315 to 0.35 and y is 0.32 to 0.355 is the region near the white point (0.33, 0.33). The number of plots is 500.

As shown in FIG. 23 to FIG. 25, even if the total thickness of the silicon nitride 310 and the silicon nitride 312 was set, the chromaticity variation was not improved.

While preferred embodiments have been described above, the present invention is not limited to such embodiments. The contents disclosed in the embodiments are merely examples, and various changes can be made without departing from the spirit of the present invention. Appropriate changes that have been made without departing from the spirit of the present invention naturally fall within the technical scope of the present invention.

What is claimed is:

1. A display device comprising:
a display region including a plurality of pixels, the pixels comprising:
a first nitride insulating film arranged on a first substrate;
a gate electrode arranged along a first direction on the first nitride insulating film;
a second nitride insulating film arranged on the gate electrode;
a first oxide insulating film arranged on the second nitride insulating film;
an oxide semiconductor layer arranged on the first oxide insulating film,
a source electrode and a drain electrode in contact with the oxide semiconductor layer;
a planarization film arranged on the gate electrode, the oxide semiconductor layer, and the source electrode and including an opening region; and
a pixel electrode arranged over the first oxide insulating film and electrically connected to the drain electrode,
wherein the gate electrode has a first titanium layer, an aluminum layer, and a second titanium layer stacked in order from the first nitride insulating film side,
a thickness of the second titanium layer is greater than a thickness of the first titanium layer,
the opening region is arranged outside the gate electrode and the oxide semiconductor layer, and
the pixel electrode is extended to the opening region and exposed from the planarization film.

2. The display device according to claim 1, wherein the thickness of the second titanium layer is 5 times or more and 10 times or less the thickness of the first titanium layer.

3. The display device according to claim 2, wherein a thickness of the first nitride insulating film is greater than a thickness of the second nitride insulating film.

4. The display device according to claim 1, wherein the first titanium layer is in contact with the first nitride insulating film.

5. The display device according to claim 4, wherein the thickness of the second nitride insulating film is 200 nm or more and 400 nm or less.

6. The display device according to claim 4, wherein the second nitride insulating film and the first oxide insulating film function as gate insulating films.

7. The display device according to claim 1, wherein the first nitride insulating film is in contact with the second nitride insulating film, and a total thickness of the first nitride insulating film and the second nitride insulating film is 600 nm or more and 1000 nm or less.

8. The display device according to claim 1, further comprising:
a second substrate arranged opposite the first substrate;
a liquid crystal layer arranged between the first substrate and the second substrate; and
a light source arranged so that light enters toward a side surface of the first substrate or a side surface with the second substrate.

9. The display device according to claim 8, wherein the liquid crystal layer is a polymer-dispersed liquid crystal,
an image is displayed in a display region when the polymer-dispersive liquid crystal is in a scattering state, and
a background of the second substrate is visible from the first substrate and a background of the first substrate is visible from the second substrate in the display region when the polymer-dispersed liquid crystal is in a non-scattering state.

10. The display device according to claim 1, wherein a width of the gate electrode is greater than a width of the oxide semiconductor layer in the first direction.

11. The display device according to claim 1, wherein the first nitride insulating film, the gate electrode, the second nitride insulating film, the first oxide insulating film, and the oxide semiconductor layer overlap with each other in the plan view.

12. The display device according to claim 1, wherein a part of the source electrode overlaps with the gate electrode in the plan view, and
a part of the drain electrode overlaps with the gate electrode in the plan view.

13. The display device according to claim 1, wherein the first nitride insulating film, the gate electrode, the second nitride insulating film, the first oxide insulating film, the oxide semiconductor layer, and the source electrode overlap with each other in the plan view, and
the first nitride insulating film, the gate electrode, the second nitride insulating film, the first oxide insulating film, the oxide semiconductor layer, and the drain electrode overlap with each other in the plan view.

14. The display device according to claim 1, wherein the gate electrode and the oxide semiconductor layer overlap each other in a plan view.

15. The display device according to claim 1, further comprising:
a third nitride insulating film arranged on the first oxide insulating film; and
a fourth nitride insulating film arranged on the third nitride insulating film and the planarization film, wherein
the third nitride insulating film is in contact with the fourth nitride insulating film in the opening region of the pixel.

* * * * *